US012808459B2

(12) United States Patent
Chang et al.

(10) Patent No.: US 12,808,459 B2
(45) Date of Patent: Nov. 24, 2026

(54) NORMALLY-OPEN PIEZOELECTRIC MEMS VALVE

(71) Applicant: Taiwan Semiconductor Manufacturing Company, Ltd., Hsinchu (TW)

(72) Inventors: Yi-Hsien Chang, Shetou Township (TW); Fu-Chun Huang, Zhubei City (TW); Po-Chen Yeh, New Taipei City (TW); Ching-Hui Lin, Taichung City (TW); Chao-Hung Chu, Keelung City (TW); Chun-Ren Cheng, Hsin-Chu City (TW); Shih-Fen Huang, Jhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 19/264,917

(22) Filed: Jul. 10, 2025

(65) Prior Publication Data

US 2025/0334204 A1 Oct. 30, 2025

Related U.S. Application Data

(63) Continuation of application No. 18/618,084, filed on Mar. 27, 2024.

(Continued)

(51) Int. Cl.
*F16K 99/00* (2006.01)
*H10N 30/01* (2023.01)

(Continued)

(52) U.S. Cl.
CPC ...... *F16K 99/0007* (2013.01); *F16K 99/0048* (2013.01); *H10N 30/01* (2023.02);

(Continued)

(58) Field of Classification Search
CPC ............ F16K 99/0007; F16K 99/0048; F16K 99/0015; F16K 2099/0074;

(Continued)

(56) References Cited

U.S. PATENT DOCUMENTS 3,365,592 A 1/1968 Krautwald et al.
4,237,399 A 12/1980 Sakamoto (Continued)

FOREIGN PATENT DOCUMENTS

DE 19856583 A1 6/2000
KR 20160006763 A 1/2016
KR 20210020905 A 2/2021

OTHER PUBLICATIONS

Cooksey et al. "A multi-purpose microfluidic perfusion system with combinatorial choice of inputs, mixtures, gradient patterns, and flow rates." Lab Chip, 2009, 9, 417-426, published on Nov. 7, 2008.

(Continued)

*Primary Examiner* — Minh Q Le
(74) *Attorney, Agent, or Firm* — Eschweiler & Potashnik, LLC

(57) ABSTRACT

Various embodiments of the present disclosure are directed to a normally-open piezoelectric microelectromechanical systems (MEMS) device. A cantilever has a first end overlying and bonded to a substrate and further has a second end, opposite the first end, overlying an actuator cavity. A piezoelectric actuator is on the cantilever. A valve vane is bonded to the second end of the cantilever and further overlies a valve cavity laterally adjacent to the actuator cavity. The cantilever curves downward from the first end to the second end, such that the valve vane is inclined and the valve cavity is open. Actuation of the piezoelectric actuator curves the cantilever upward to close the valve cavity.

20 Claims, 29 Drawing Sheets

Related U.S. Application Data

(60) Provisional application No. 63/612,547, filed on Dec. 20, 2023.

(51) Int. Cl.
*H10N 30/20* (2023.01)
*B81B 7/02* (2006.01)
*B81C 1/00* (2006.01)

(52) U.S. Cl.
CPC ............ *H10N 30/2045* (2023.02); *B81B 7/02* (2013.01); *B81C 1/00015* (2013.01); *B81C 1/0015* (2013.01); *F16K 99/0015* (2013.01); *F16K 2099/0074* (2013.01); *F16K 2099/008* (2013.01); *F16K 2200/3052* (2021.08); *H10N 30/2042* (2023.02); *H10N 30/2044* (2023.02)

(58) Field of Classification Search
CPC ...... F16K 2099/008; F16K 2200/3052; H10N 30/01; H10N 30/2045; H10N 30/2044; H10N 30/2042; B81B 7/02; B81C 1/00015; B81C 1/0015
USPC ..................................................... 251/129.06
See application file for complete search history.

(56) References Cited

U.S. PATENT DOCUMENTS 4,492,360 A 1/1985 Lee, II et al.
5,357,108 A 10/1994 Suzuki et al.
5,441,597 A 8/1995 Bonne et al.
6,214,244 B1 4/2001 Silverbrook
8,366,602 B2 2/2013 Birk et al.
8,556,227 B2 10/2013 Buestgens et al.
9,638,350 B2 5/2017 Buestgens
12,358,782 B2 * 7/2025 Chen .................... B81B 3/0051
12,413,914 B2 9/2025 Chen et al.
2003/0222236 A1 12/2003 Eberhardt et al.
2003/0230346 A1 * 12/2003 Dorfler ................ F16K 31/006
137/596.17
2007/0090314 A1 4/2007 Van Der Wijngaart et al.
2009/0009030 A1 1/2009 Freidhoff et al.
2009/0026892 A1 1/2009 Nakamura et al.
2010/0112233 A1 5/2010 Iwamoto et al.
2011/0073188 A1 3/2011 Marcus et al.
2011/0073788 A1 3/2011 Marcus et al.
2012/0176703 A1 7/2012 Nojima et al.
2013/0271804 A1 10/2013 Horie et al.
2013/0272902 A1 10/2013 Noth et al.
2014/0077662 A1 3/2014 Lueke et al.
2014/0191616 A1 7/2014 Toyoda et al.
2014/0333703 A1 11/2014 Buskirk et al.
2014/0368087 A1 12/2014 Hiraoka et al.
2015/0300526 A1 10/2015 Livermore-Clifford et al.
2017/0155038 A1 6/2017 Caraveo et al.
2019/0346051 A1 11/2019 Buskirk et al.
2020/0025311 A1 1/2020 Huff
2020/0194659 A1 * 6/2020 Giusti .................... H10N 30/01
2021/0024350 A1 * 1/2021 Dosev .................. B81B 3/0021
2021/0165211 A1 6/2021 Schatz
2021/0328128 A1 10/2021 Buestgens
2023/0012046 A1 1/2023 Qian et al.
2023/0386948 A1 11/2023 Lin et al.
2024/0397828 A1 11/2024 Lin et al.
2024/0401714 A1 12/2024 Chang et al.

OTHER PUBLICATIONS

Zahra et al. "Design and fabrication of microfluidics system integrated with temperature actuated microvalve." Sensors and Actuators A 236 (2015) 206-213, published on Nov. 2, 2015.
Tice et al. "Control of pressure-driven components in integrated microfluidic devices using an on-chip electrostatic microvalve." RSC Adv., 2014, 4, 51593, published on Oct. 2, 2014.
Sugiura et al. "Fabrication of Microfluidic Valves Using a Hydrogel Molding Method" Scientific Reports | 5:13375 | DOI: 10.1038/srep13375, published on Aug. 24, 2015.
Tani et al. "A Combination of Fast Resonant Mode and Slow Static Deflection of SOI-PZT Actuators for MEMS Image Projection Display" IEEE/LEOS International Conference on Optical MEMS and Their Applications Conference, 2006. Published on Oct. 9, 2006.
AliExpress. "Earphones Replacement battery for Apple Airpods Pro headphoneairpods pro replacement battery 1154-60mAh" The date of publication is unknown. Retrieved online on Jan. 10, 2024 from https://www.aliexpress.com/i/3256802409051730.html?gatewayAdapt=4itemAdapt.
Xiaobai. "Enter Knowles' world's largest silicon microphone factory and discover the story behind its 12 billion microphones" 52 Audio, published on Jul. 9, 2019.
Wikipedia.org. "Eutectic bonding" Published on Aug. 20, 2021.
Sugiura et al. "Fabrication of Microfluidic Valves Using a Hydrogel Molding Method" Scientific Reports 5, Article No. 13375 (2015), published on Aug. 24, 2015.
Hionix. "Stress" The date of publication is unknown. Retrieved online on Jan. 24, 2024 from https://hionix.com/stress/#:~:text=If%20it%20is%20uniform%2C%20the,is%20on%20the%20convex%20side.
Ware. "In-ear or half in-ear? Knowles'smicro valve for next generation TWS| Ware 2019" Published on Jul. 24, 2019.
Lee et al. "Micromachined pre-focused 1×N flow switches for continuous sample injection" J. Micromech. Microeng. 11 (2001) 567-573, published on Aug. 9, 2001.
Voiculescu et al. "Nano and Microsensors for Mammalian Cell Studies" Micromachines 2018, 9, 439; doi: 10.3390/mi9090439, published on Aug. 31, 2018.
Wikipedia.org "Piezoelectric sensor" Published on Jan. 9, 2024.
Thomas, Sotiris. "An Evaluation of Silicon Carbide Based Bimorph Actuators for Optical Coherence Tomography Applications" Delft University of Technology, published on Dec. 3, 2015.
Debnath et al. "Meandering-trapezoidal shaped MEMS structure for low frequency vibration based energy harvesting applications" Sustainable Energy Technologies and Assessments 42 (2020) 100881, published on Nov. 1, 2020.
Yang, Carmen Emily. "What is the Piezoelectric Effect?" Electronic Design, published on Oct. 26, 2022.
Notice of Allowance dated Apr. 21, 2026 for U.S. Appl. No. 18/618,084.

* cited by examiner

NORMALLY-OPEN PIEZOELECTRIC MEMS VALVE

REFERENCE TO RELATED APPLICATIONS

This Application is a Continuation of U.S. application Ser. No. 18/618,084, filed on Mar. 27, 2024, which claims the benefit of U.S. Provisional Application No. 63/612,547, filed on Dec. 20, 2023. The contents of the above-referenced Patent Applications are hereby incorporated by reference in their entirety.

BACKGROUND

Microelectromechanical systems, or MEMS, is a technology that integrates miniaturized mechanical and electromechanical elements on an integrated chip. MEMS devices are often made using micro-fabrication techniques. In recent years, MEMS devices have found a wide range of applications. For example, MEMS devices are found in handheld devices (e.g., accelerometers, gyroscopes, and digital compasses), pressure sensors (e.g., crash sensors), microfluidic elements (e.g., valves and pumps), optical switches (e.g., mirrors), and so on.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
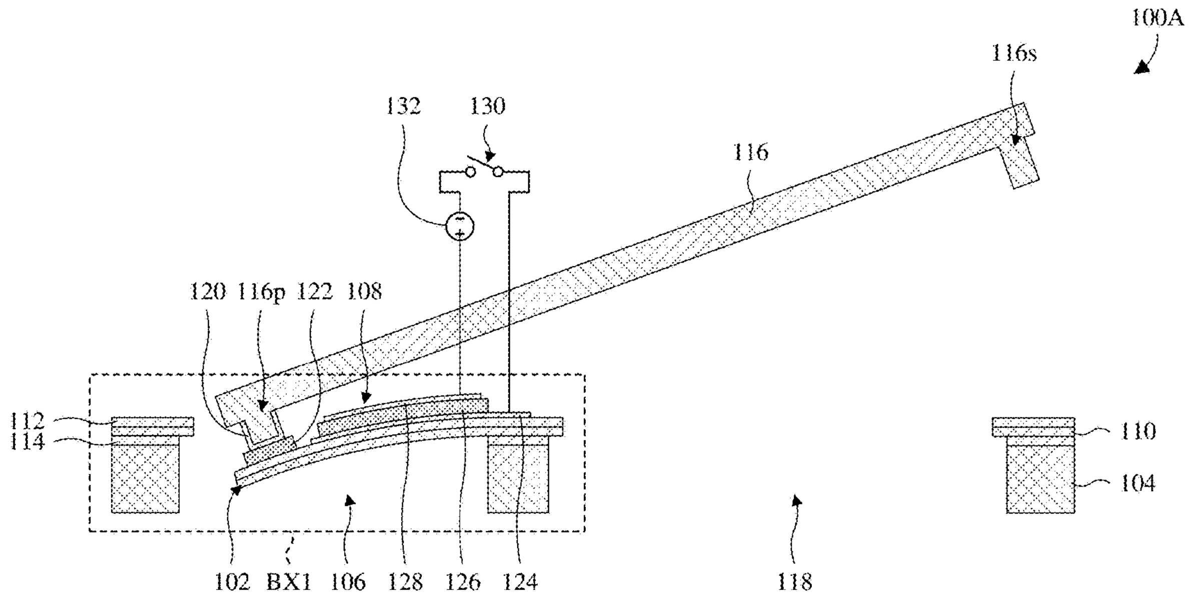
FIGS. 1A and 1B illustrate cross-sectional views of some embodiments of a piezoelectric microelectromechanical systems (MEMS) valve in a released state.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Microvalves find application in microfluidics for controlling the flow of fluids through microchannels. However, some microvalves are unable to fully close. As such, fluid may leak and/or diffuse through the microvalves. Further, some microvalves depend on external power and/or piping to operate. For example, pneumatic microvalves depend on an external source of pneumatic power and piping to carry the pneumatic power. Further, at least some of such microvalves intrinsically close in the absence of power (e.g., are normally closed) and hence depend on power for open operation. However, for applications in which a microvalve is open more often than closed, this leads to high power consumption.

Beyond microfluidics, microvalves also find application for pressure control. For example, microvalves may be integrated into ear pods to reduce the occlusion effect. The occlusion effect refers to pressure caused by sound waves becoming trapped in one's ear canals due to occlusion of the ear canals by the ear pods. The occlusion effect may be reduced by opening the ear canals with microvalves of the ear pods during normal use of the ear pods and by closing the microvalves during use of active noise cancellation (ANC). However, microvalves in ear pods are bulky, expensive, have high noise, and high power consumption.

The present application is directed to a piezoelectric MEMS valve that is normally open. The piezoelectric MEMS valve finds application in microfluidic control, pressure control (e.g., to relieve the occlusion effect in ear pods), and so on. In some embodiments, the piezoelectric MEMS valve comprises a cantilever beam, a piezoelectric actuator, and a valve vane. The cantilever beam has a first end overlying and bonded to a substrate and a second end overlying an actuator cavity. The piezoelectric actuator is on the cantilever beam, and the valve vane overlies and is bonded to the second end of the cantilever beam.

The cantilever beam is formed in part by a layer having residual compressive stress. The residual compressive stress causes the cantilever beam to intrinsically curve downward from the first end to the second end, absent external factors to counter the curve downward. Further, because the valve vane is bonded to the second end, the curve downward inclines the valve vane relative to a top surface of the substrate to open a valve cavity. On the other hand, electrical activation of the piezoelectric actuator generates tensile stress that counters the residual compressive stress. As a result, the cantilever beam curves upward from the first end to the second end to move the valve vane to a more level position that closes the valve cavity.

Because of the residual compressive stress, the piezoelectric MEMS valve is normally open without any external power and/or piping. This leads to low power consumption at least for applications in which the piezoelectric MEMS valve is open more often than closed. Further, because the piezoelectric actuator is used to close the piezoelectric MEMS valve, the piezoelectric MEMS valve may be readily controlled (e.g., by voltage control and/or capacitive control) and the valve vane may form a tight seal that prevents leakage while the piezoelectric MEMS valve is closed. Further yet, the piezoelectric MEMS valve may be formed using semiconductor manufacturing processes. This reduces costs and allows a small form factor to be achieved for microfluidics, wearable applications, and so on.

Figure 1B:
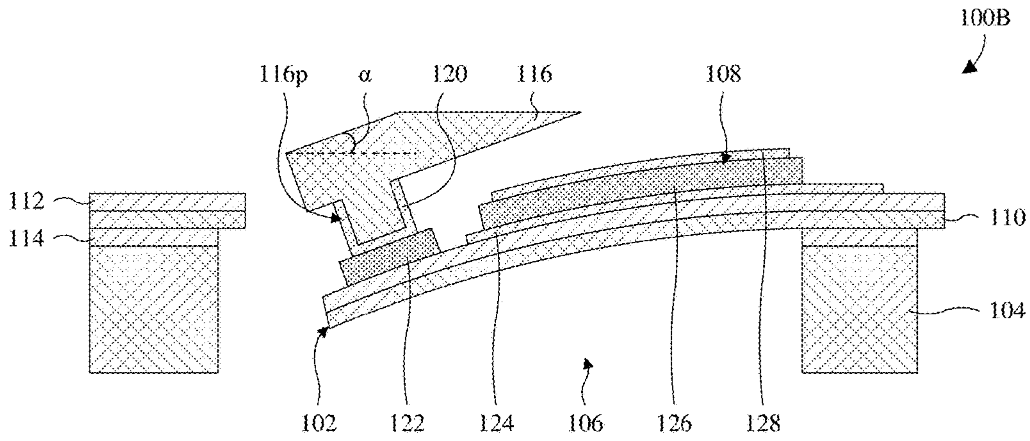

With reference to FIGS. 1A and 1B, cross-sectional views 100A, 100B of some embodiments of a piezoelectric MEMS valve in a released state is provided. FIG. 1B provides an enlarged cross-sectional view 100B of a portion of the piezoelectric MEMS valve within box BX1 of FIG. 1A. The released state corresponds to an intrinsic state of the piezoelectric MEMS valve without external factors (e.g., external power, force, stress, etc.) acting on piezoelectric MEMS valve. Further, in the released state, the piezoelectric MEMS valve is open.

A cantilever 102 has a first end overlying and bonded to a substrate 104, and has a second end, opposite the first end, overlying an actuator cavity 106 extending through the substrate 104. In some embodiments, the cantilever 102 may be regarded as beam shaped or lever shaped. Further, the cantilever 102 supports a piezoelectric actuator 108 and is formed from a semiconductor layer 110 and a device dielectric layer 112. The semiconductor layer 110 overlies and is spaced from the substrate 104 by a substrate dielectric layer 114, and the device dielectric layer 112 overlies the semiconductor layer 110.

The piezoelectric actuator 108 and the device dielectric layer 112 have residual compressive stress, such that the piezoelectric actuator 108 and the device dielectric layer 112 want to expand outward. This leads to an outward force along a top of the semiconductor layer 110 that causes the cantilever 102 to intrinsically curve downward. Further, because the piezoelectric MEMS valve is released, there are no external factors to counter the outward force and the curve downward, whereby the cantilever 102 curves downward from the first end of the cantilever 102 to the second end of the cantilever 102.

A valve vane 116 overlies the cantilever 102 and a valve cavity 118, which extends through the substrate 104 and which is laterally separated from the actuator cavity 106. The valve vane 116 has a pad protrusion 116*p* and a stopper protrusion 116*s* protruding from a bottom of the valve vane 116, respectively on opposite ends of the valve vane 116. The pad protrusion 116*p* is lined by a vane bond pad 120 and is bonded to the second end of the cantilever 102 via a cantilever bond pad 122 on the second end.

Because the cantilever 102 curves downward to the second end of the cantilever 102, and because the valve vane 116 is bonded to the second end, a top surface of the valve vane 116 is inclined relative to a top or bottom surface of the substrate 104. For example, an angle $\alpha$ between the top surface of the valve vane 116 and the top surface of the substrate 104 (shown in FIG. 1B) may be greater than about 25 degrees, about 45 degrees, about 65 degrees, or some other suitable value. Further, because of the incline, the valve cavity 118 is open. Fluid may pass through the valve cavity 118 unimpeded by the valve vane 116.

Because the cantilever 102 curves downward intrinsically, the piezoelectric MEMS valve is normally open without any external power and/or piping. This leads to low power consumption at least for applications in which a piezoelectric MEMS valve is open more often than closed. Further, as seen hereafter, the piezoelectric MEMS valve may be formed using semiconductor manufacturing processes. This reduces costs and allows a small form factor to be achieved for microfluidics, wearable applications, and so on.

With continued reference to FIGS. 1A and 1B, the piezoelectric actuator 108 comprises a bottom electrode 124, a piezoelectric layer 126 overlying the bottom electrode 124, and a top electrode 128 overlying the piezoelectric layer 126. Further, the piezoelectric actuator 108 is released or unactuated, as schematically illustrated by a switch 130. The switch 130 is in an open state and selectively electrically couples a power supply 132 from the top electrode 128 to the bottom electrode 124. As seen hereafter, the piezoelectric actuator 108 may be actuated (e.g., by closing the switch 130) to close the piezoelectric MEMS valve.

While unactuated, the piezoelectric actuator 108 as a whole has a residual compressive stress that applies an outward force along a top of the device dielectric layer 112 and the semiconductor layer 110. In some embodiments, the top electrode 128 and the bottom electrode 124 have residual tensile stress, whereas the piezoelectric layer 126 has residual compressive stress that counters and surpasses the residual tensile stress, such that the piezoelectric actuator 108 as a whole has residual compressive stress.

In some embodiments, compressive or tensile stress of a layer (e.g., the device dielectric layer 112, the piezoelectric layer 126, etc.) may be regarded as compressive or tensile stress that the layer experiences when it is in a standalone condition or not in contact with anything else. Further, in some embodiments, the compressive or tensile stress of the layer may be intrinsic or extrinsic. Intrinsic stress may, for example, be stress that is present at deposition of the layer. Extrinsic stress may, for example, be stress arising from changes in external factors (e.g., temperature, mechanical force, etc.) after deposition of the layer. In some embodiments, the residual compressive stress of the device dielectric layer 112 and the piezoelectric layer 126 is intrinsic, the residual tensile stress of the top electrode 128 and the bottom electrode 124 is intrinsic, and the semiconductor layer 110 has no intrinsic stress.

In some embodiments, the substrate 104 is or comprises silicon and/or some other suitable substrate material(s). In some embodiments, the substrate dielectric layer 114 is or comprises silicon oxide (e.g., $SiO_2$) and/or some other suitable dielectric(s). In some embodiments, the semiconductor layer 110 is or comprises silicon, polysilicon, some other suitable semiconductor(s), or any combination of the foregoing. In some embodiments, the substrate 104, the substrate dielectric layer 114, and the semiconductor layer 110 correspond to a semiconductor-on-insulator substrate or the like.

In some embodiments, a thickness of the substrate 104 is about 200-1000 micrometers, about 200-600 micrometers, about 600-1000 micrometers, or some other suitable value. In some embodiments, a thickness of the substrate dielectric layer 114 is about 0.1-5 micrometers, about 0.1-2.5 micrometers, about 2.5-5 micrometers, or some other suitable value. In some embodiments, a thickness of the semiconductor layer 110 is about 0.1-50 micrometers, about 0.1-25 micrometers, about 25-50 micrometers, or some other suitable value.

In some embodiments, the device dielectric layer 112 is or comprises silicon oxide (e.g., $SiO_2$), titanium oxide (e.g., $TiO_2$), some other suitable dielectric(s), or any combination of the foregoing. In some embodiments, a thickness of the device dielectric layer 112 is about 0.1-10 micrometers, about 0.1-5 micrometers, about 5-10 micrometers, or some other suitable value.

In some embodiments, the bottom electrode 124 is or comprises platinum (e.g., Pt) and/or some other suitable conductive material(s). In some embodiments, the piezoelectric layer 126 is or comprises sol-gel, lead zirconate titanate (PZT), lead-free potassium sodium niobate (KNN), aluminum nitride (AlN), some other suitable piezoelectric material(s), or any combination of the foregoing. In some embodiments, the top electrode 128 is or comprises platinum (e.g., Pt), ruthenium (e.g., Ru), some other suitable conductive material(s), or any combination of the foregoing.

In some embodiments, a thickness of the bottom electrode 124 is about 500-10000 angstroms, about 500-5000 angstroms, about 5000-10000 angstroms, or some other suitable value. In some embodiments, a thickness of the piezoelectric layer 126 is about 2000-50000 angstroms, about 2000-25000 angstroms, about 25000-50000 angstroms, or some other suitable value. In some embodiments, a thickness of the top electrode 128 is about 500-100000 angstroms, about 500-25000 angstroms, about 25000-50000 angstroms, about 50000-75000 angstroms, about 75000-100000 angstroms, or some other suitable value.

In some embodiments, the cantilever bond pad 122 and the vane bond pad 120 directly contact each other at a fusion bond and/or a eutectic bond. Other suitable bond types are, however, amenable in alternative embodiments. In some embodiments, a thickness of the cantilever bond pad 122 is about 3000-8000 angstroms, about 3000-5500 angstroms, about 5500-8000 angstroms, or some other suitable value. In some embodiments, the cantilever bond pad 122 and/or the vane bond pad 120 has/have residual tensile stress that is counteracted and surpassed by the residual compressive stress of the device dielectric layer 112, such that the cantilever 102 maintains its intrinsic curve downward.

The cantilever bond pad 122 may, for example, be or comprise gold (e.g., Au), aluminum copper (e.g., AlCu), copper (e.g., Cu), tin (e.g., Sn), silicon oxide (e.g., $SiO_2$), some other suitable bond material(s), or any combination of the foregoing. The vane bond pad 120 may, for example, be or comprise gold (e.g., Au), germanium (e.g., Ge), silicon (e.g., Si), some other suitable bond material(s), or any combination of the foregoing.

In some embodiments, the cantilever bond pad 122 and the vane bond pad 120 are both gold. In other embodiments, the cantilever bond pad 122 is aluminum copper and the vane bond pad 120 is germanium, gold, or silicon. In other embodiments, the cantilever bond pad 122 is silicon dioxide and the vane bond pad 120 is silicon. In other embodiments, the cantilever bond pad 122 is tin and the vane bond pad 120 is gold. In other embodiments, the cantilever bond pad 122 and the vane bond pad 120 are some other suitable materials.

In some embodiments, the thickness of the cantilever bond pad 122 is about 3000-5000 angstroms, the thickness of the top electrode 128 is about 1000 angstroms, the thickness of the piezoelectric layer 126 is about 2000-20000 angstroms, the thickness of the bottom electrode 124 is about 1000 angstroms, the thickness of the device dielectric layer 112 is about 10000-20000 angstroms, and/or the thickness of the device dielectric layer 112 is about 50000 angstroms. Other suitable values are, however, amenable.

In some embodiments, the valve vane 116 is or comprises glass, an interposer, silicon, plastic, ceramic, metal, some other suitable material(s), or any combination of the foregoing. In some embodiments, a thickness of the valve vane 116 is about 10-300 micrometers, about 10-155 micrometers, about 155-300 micrometers, or some other suitable value. In some embodiments, a height of the pad protrusion 116*p* is about 1-10 micrometers, about 1-5.5 micrometers, about 5.5-10 micrometers, or some other suitable value. In some embodiments, a height of the stopper protrusion 116*s* is about 1-10 micrometers, about 1-5.5 micrometers, about 5.5-10 micrometers, or some other suitable value.

Figure 2:
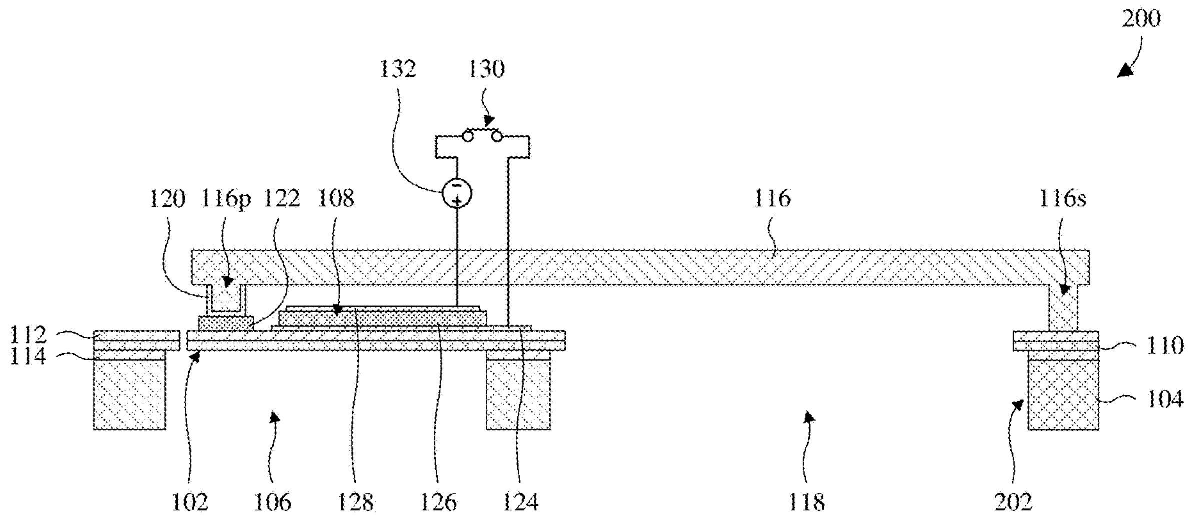
FIG. 2 illustrates a cross-sectional view of some embodiments of the piezoelectric MEMS valve of FIGS. 1A and 1B in an actuated state.

With reference to FIG. 2, a cross-sectional view 200 of some embodiments of the piezoelectric MEMS valve of FIGS. 1A and 1B in an actuated state is provided. The actuated state corresponds to an electrically powered state of the piezoelectric MEMS valve. Further, in the actuated state, the piezoelectric MEMS valve is closed.

Actuation of the piezoelectric MEMS valve occurs by actuation of the piezoelectric actuator 108. For example, the switch 130 may be closed, thereby electrically coupling the power supply 132 from the top electrode 128 to the bottom electrode 124. Such actuation changes the piezoelectric actuator 108 from compressive stress to tensile stress. As a result, the piezoelectric actuator 108 wants to contract and applies an inward force along a top of the device dielectric layer 112 and the semiconductor layer 110. This counteracts and surpasses the outward force from the device dielectric layer 112, whereby the cantilever 102 curves upward beginning from its orientation in FIGS. 1A and 1B.

Because the valve vane 116 is bonded to the second end of the cantilever 102, the curve upward decreases the incline of the valve vane 116 (e.g., declines or levels the valve vane 116). The decrease in incline continues until the stopper protrusion 116*s* comes into contact with a wall structure 202 on an opposite side of the valve cavity 118 as the piezoelectric actuator 108. Further, once the stopper protrusion 116*s* comes into contact with the wall structure 202, the valve vane 116 transfers a force from the wall structure 202 to the cantilever 102 that stops the curve upward of the cantilever 102.

With the stopper protrusion 116*s* in contact with the wall structure 202, the valve vane 116 closes the valve cavity 118. As such, fluid is unable to flow through the piezoelectric MEMS valve and the piezoelectric MEMS valve is closed. Further, a top surface of the valve vane 116 is parallel or substantially parallel with a top or bottom surface of the substrate 104, and the cantilever 102 has a planar or substantially planar profile. As seen hereafter, a curved profile may also be amenable.

To return the piezoelectric MEMS valve to open, the piezoelectric actuator 108 may be released. For example, the switch 130 may be opened as in FIGS. 1A and 1B. This reverts the piezoelectric actuator 108 to its intrinsic state in which it is has compressive stress. The compressive stress of the piezoelectric actuator 108 and the compressive stress of the device dielectric layer 112 then cause the cantilever 102 to curve downward, thereby inclining the valve vane 116 and opening the valve cavity 118 as seen in FIGS. 1A and 1B.

Figure 3:
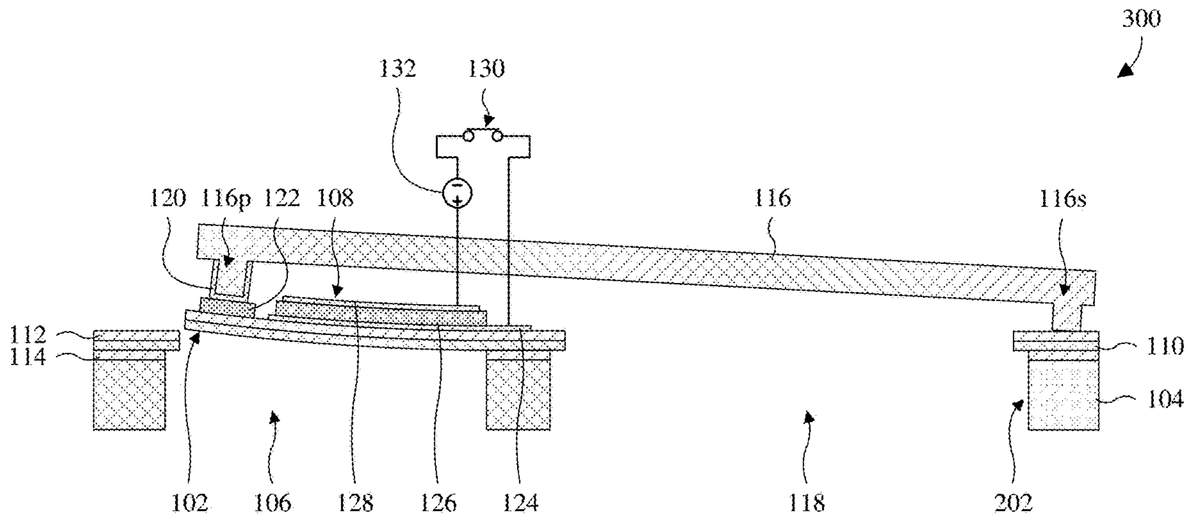
FIG. 3 illustrates a cross-sectional view of some alternative embodiments of the piezoelectric MEMS valve of FIG. 2.

With reference to FIG. 3, a cross-sectional view 300 of some alternative embodiments of the piezoelectric MEMS valve of FIG. 2 is provided in which a height of the stopper protrusion 116*s* has been reduced. Because of the reduced height, the cantilever 102 curves upward more (e.g., compared to FIG. 2) before the stopper protrusion 116*s* hits the wall structure 202. As a result, the cantilever 102 has an upward-curved profile, instead of the planar profile of FIG. 2, while the piezoelectric MEMS valve is closed. Further, a top surface of the valve vane 116 is angled relative to a top or bottom surface of the substrate 104.

Figure 4:
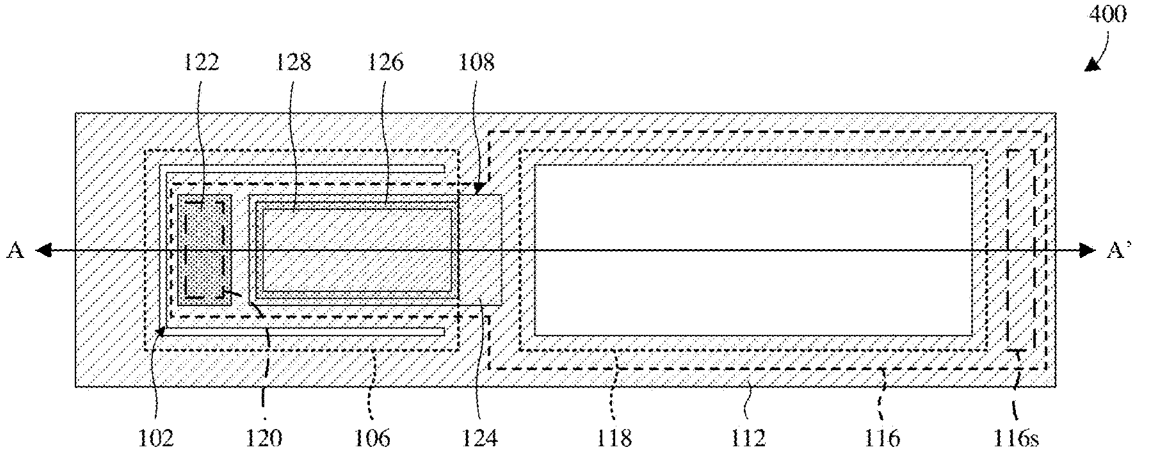
FIG. 4 illustrates a top layout view of some embodiments of the piezoelectric MEMS valve of FIG. 2.

With reference to FIG. 4, a top layout view 400 of some embodiments of the piezoelectric MEMS valve of FIG. 2 is provided. The cross-sectional view 200 of FIG. 2 may, or example, be taken along line A-A' in FIG. 4 or along some other suitable line in FIG. 4. Further, several components of the piezoelectric MEMS valve (e.g., the valve vane 116, the stopper protrusion 116*s*, and so on) are shown in phantom.

The valve vane 116 completely covers the valve cavity 118 while the piezoelectric MEMS valve is in the actuated state, thereby closing the piezoelectric MEMS valve and preventing the flow of fluid through the piezoelectric MEMS valve. Further, the valve vane 116 bonds to the cantilever 102 at only the second end of the cantilever 102, which overlaps with the actuator cavity 106. When the piezoelectric MEMS valve is in the released state, the cantilever 102 bends down (in cross-section) into the actuator cavity 106 to incline the valve vane 116 and open the piezoelectric MEMS valve so fluid may flow through the piezoelectric MEMS valve.

While the top layout view 400 of FIG. 4 corresponds to the actuated state of the piezoelectric MEMS valve, the top layout view 400 is generally applicable to the released state of the piezoelectric MEMS valve in FIGS. 1A and 1B. That is to say, the incline of the valve vane 116 and the bending of the cantilever 102 in the released state of the piezoelectric MEMS valve will minimally change the top layout view 400 of FIG. 4. Further, it is to be appreciated that in at least some embodiments, FIGS. 1A, 1B, 2, and 4 all correspond to a common embodiment or common embodiments of the piezoelectric MEMS valve.

Figure 5A:
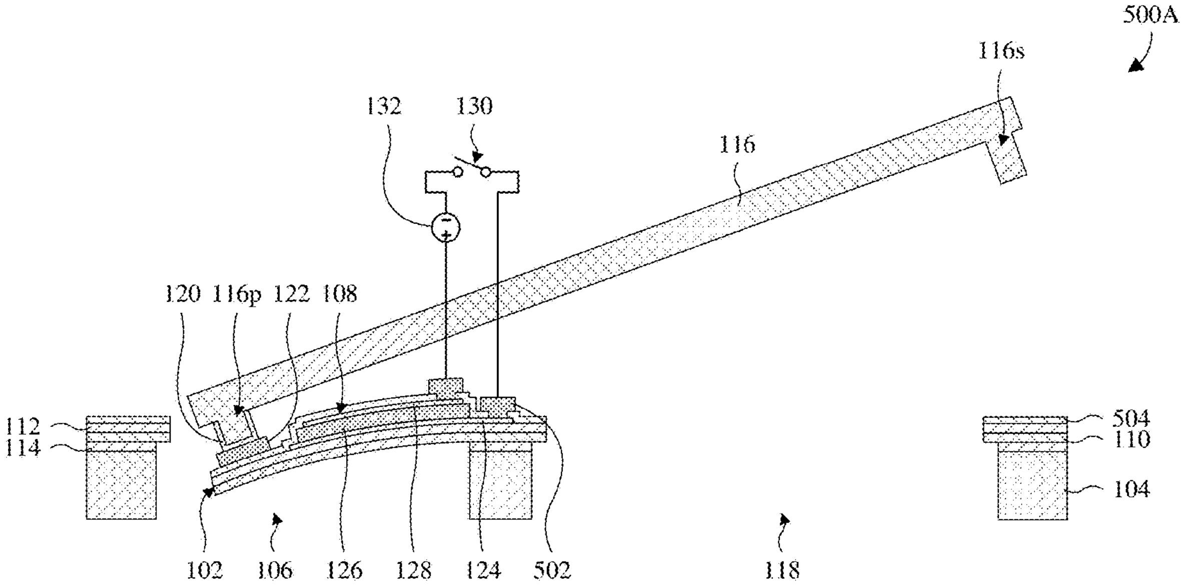
FIGS. 5A and 5B illustrate cross-sectional views of some more detailed embodiments of the piezoelectric MEMS valve of FIGS. 1A and 1B and/or FIG. 2 in which input/output (IO) structures are on a piezoelectric actuator of the piezoelectric MEMS valve.
Figure 5B:
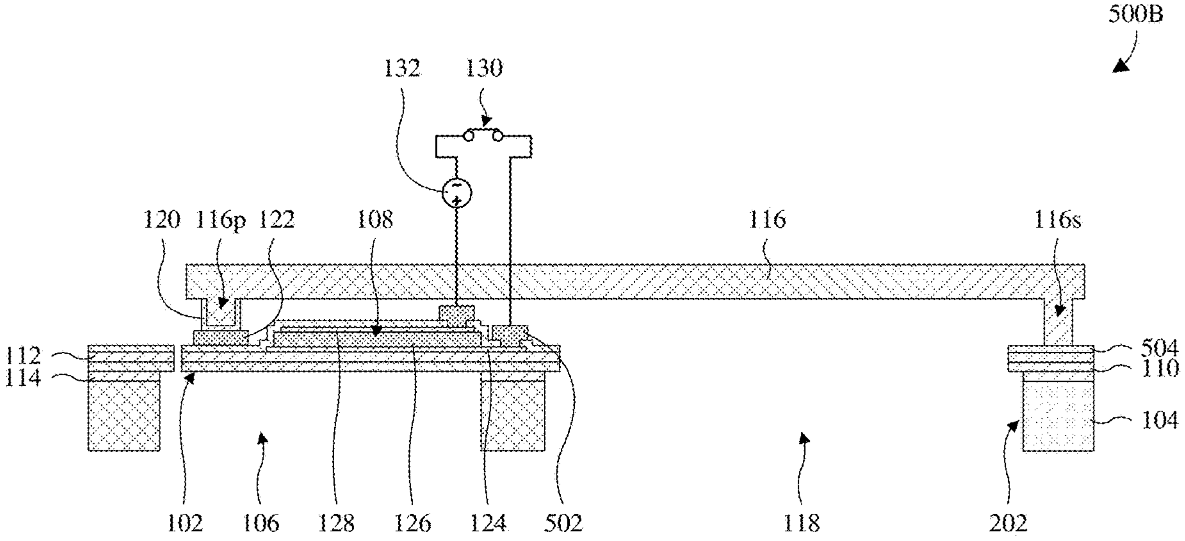

With reference to FIGS. 5A and 5B, cross-sectional views 500A, 500B of some more detailed embodiments of the piezoelectric MEMS valve of FIGS. 1A and 1B and/or FIG. 2 are provided in which a pair of input/output (IO) structures 502 are on the piezoelectric actuator 108. FIG. 5A corresponds to the released state of the piezoelectric MEMS valve, and FIG. 5B corresponds to the actuated state of the piezoelectric MEMS valve.

The pair of IO structures 502 comprise a first IO structure overlying and electrically coupled to the top electrode 128, and further comprise a second IO structure overlying and electrically coupled to the bottom electrode 124. Further, the pair of IO structures 502 overlie an intermetal dielectric (IMD) layer 504 and protrude through the IMD layer 504 respectively to the top electrode 128 and the bottom electrode 124. The IMD layer 504 may also separate the cantilever bond pad 122 from the device dielectric layer 112. The pair of IO structures 502 may, for example, correspond to locations at which control circuitry (e.g., the switch 130 and the power supply 132) is electrically coupled to the piezoelectric actuator 108.

In some embodiments, the pair of IO structures 502 have individual thicknesses that are about 3000-8000 angstroms, about 3000-5500 angstroms, about 5500-8000 angstroms, or some other suitable value. In some embodiments, the pair of IO structures 502 are the same material as the cantilever bond pad 122. In some embodiments, the pair of IO structures 502 are or comprise gold (e.g., Au), aluminum copper (e.g., AlCu), copper (e.g., Cu), tin (e.g., Sn), silicon oxide (e.g., $SiO_2$), some other suitable material(s), or any combination of the foregoing. In some embodiments, the pair of IO structures 502 have residual tensile stress that is counteracted and surpassed by compressive stress of the piezoelectric actuator 108 and the device dielectric layer 112, such that the cantilever 102 maintains its intrinsic curve downward.

In some embodiments, the IMD layer 504 has residual compressive stress. Because of the residual compressive stress, the IMD layer 504 wants to expand outward. This leads to outward force along tops of the piezoelectric actuator 108, the device dielectric layer 112, and the semiconductor layer 110 to aid in the intrinsic curve downward of the cantilever 102. In some embodiments, the IMD layer 504 is or comprises aluminum oxide (e.g., $Al_2O_3$), silicon oxide (e.g., $SiO_2$), silicon nitride (e.g., $Si_3N_4$), some other suitable dielectric(s), or any combination of the foregoing. In some embodiments, a thickness of the IMD layer 504 is or comprises 1000-5000 angstroms, 1000-3000 angstroms, 3000-5000 angstroms, or some other suitable value.

Figure 6:
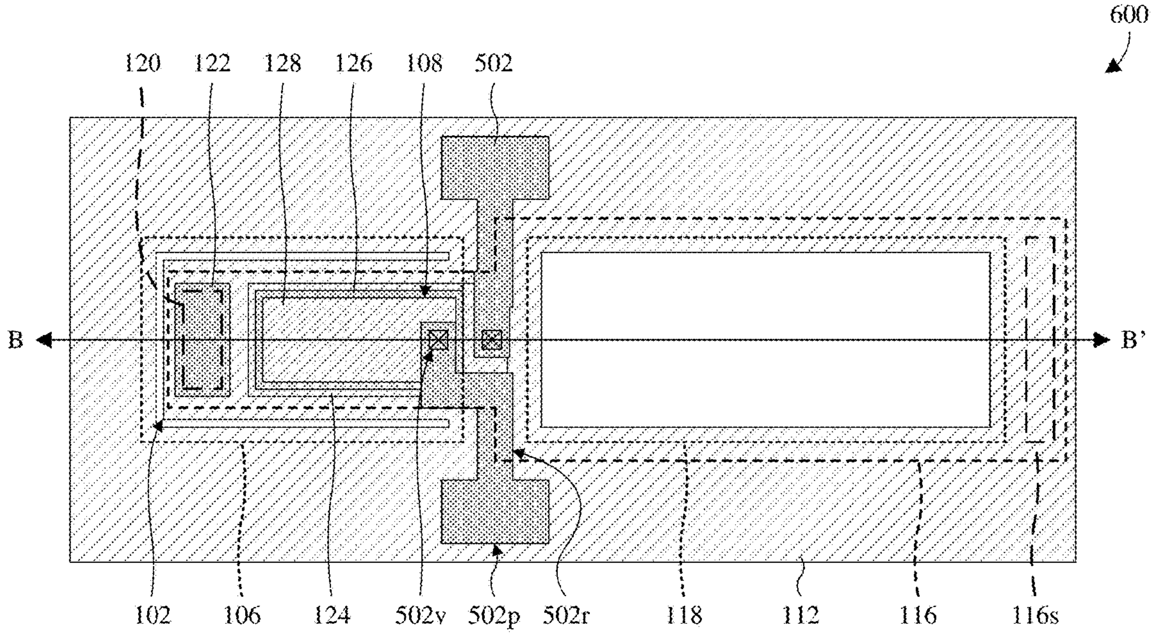
FIG. 6 illustrates a top layout view of some embodiments of the piezoelectric MEMS valve of FIGS. 5A and 5B.

With reference to FIG. 6, a top layout view 600 of some embodiments of the piezoelectric MEMS valve of FIGS. 5A and 5B is provided in the actuated state. The cross-sectional view 500B of FIG. 5B may, or example, be taken along line B-B' in FIG. 6 or along some other suitable line in FIG. 6. Further, several components of the piezoelectric MEMS valve (e.g., the valve vane 116, the stopper protrusion 116*s*, and so on) are shown in phantom, and the IMD layer 504 is omitted to show structure that would otherwise be hidden.

The pair of IO structures 502 comprise individual IO vias 502*v*, individual IO pads 502*p*, and individual redistribution portions 502*r*. The redistribution portions 502*r* have first ends respectively overlying and electrically coupled respectively to the bottom and top electrodes 124, 128 respectively by the IO vias 502*v*. Further, the redistribution portions 502*r* extend respectively from the IO vias 502*v* respectively to the IO pads 502*p*. The IO pads 502*p* are outside an area covered by the valve vane 116 and provide locations for electrically coupling control circuitry to the piezoelectric actuator 108.

While the top layout view 600 of FIG. 6 corresponds to the actuated state of the piezoelectric MEMS valve illustrated in FIG. 5B, the top layout view 600 is generally applicable to the released state of the piezoelectric MEMS valve illustrated in FIG. 5A. Further, it is to be appreciated that in at least some embodiments, FIGS. 5A, 5B, and 6 all correspond to a common embodiment or common embodiments of the piezoelectric MEMS valve.

Figure 7A:
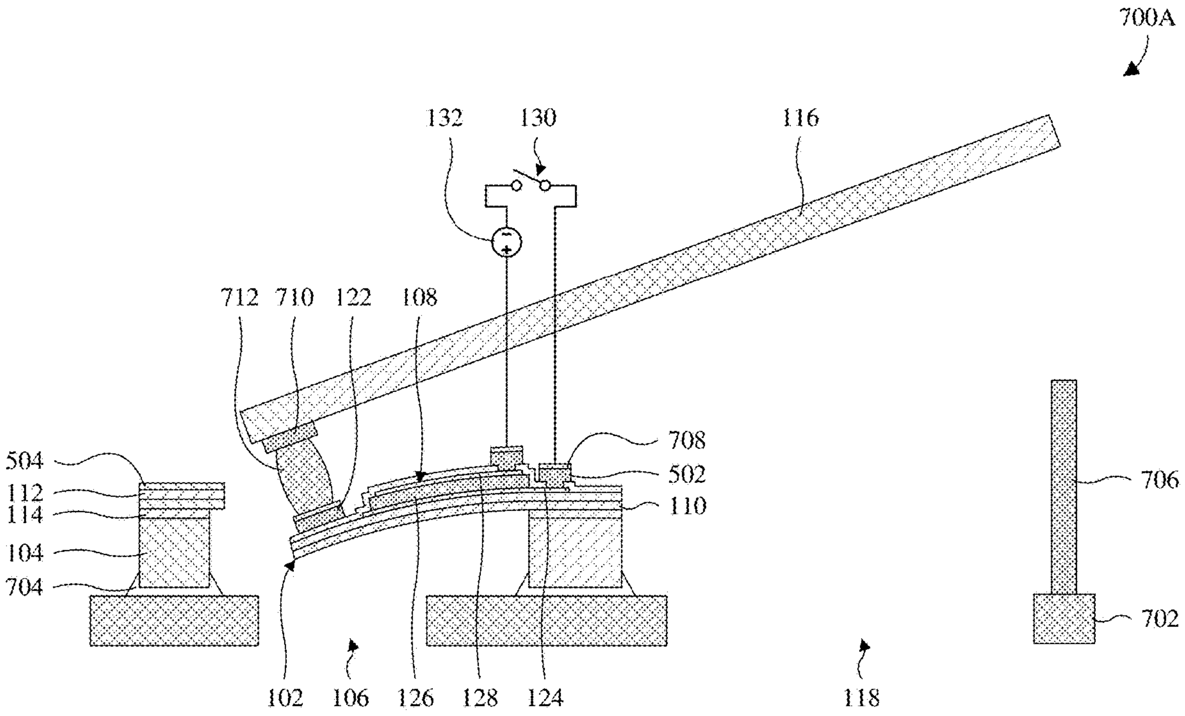
FIGS. 7A and 7B illustrate cross-sectional views of some alternative embodiments of the piezoelectric MEMS valve of FIGS. 5A and 5B.
Figure 7B:
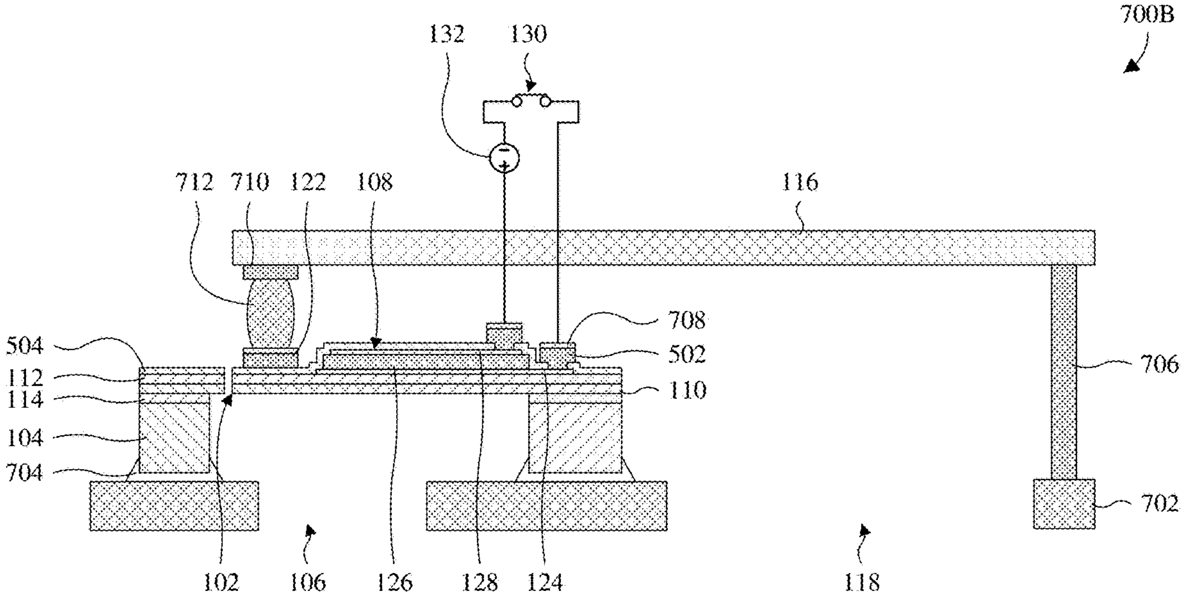

With reference to FIGS. 7A and 7B, cross-sectional views 700A, 700B of some alternative embodiments of the piezoelectric MEMS valve of FIGS. 5A and 5B are provided. FIG. 7A corresponds to the released state of the piezoelectric MEMS valve, and FIG. 7B corresponds to the actuated state of the piezoelectric MEMS valve.

The substrate 104 overlies and is bonded to a printed circuit board (PCB) 702 by an adhesive 704. The adhesive 704 may, for example, be or comprise an epoxy and/or the like. The actuator cavity 106 extends through the PCB 702 and the substrate 104. Further, the valve cavity 118 extends through the PCB 702 and further extends between an outermost sidewall of the substrate 104 and an outermost sidewall of a seal 706. This is to be contrasted with the embodiments of FIGS. 5A and 5B where the valve cavity 118 extends through the substrate 104. The seal 706 may, for example, be or comprise plastic, rubber, a seal ring, glue, epoxy, some other suitable seal material(s), or any combination of the foregoing.

The cantilever bond pad 122, as well as the IO structures 502 are covered by individual cap layers 708. The cap layers 708 may, for example, be or comprise under bump metallization (UBM) layers, nickel gold (e.g., electroless nickel immersion gold (ENIG)), nickel palladium gold (e.g., electroless nickel/electroless palladium/immersion gold (ENEPI)), over pad metal (OPM), front side metal (FSM), some other suitable metal(s) and/or conductive material(s), or any combination of the foregoing.

A bottom of the valve vane 116 has a flat or planar profile free of the pad and stopper protrusions 116*p*, 116*s*. In alternative embodiments, the pad protrusion 116*p* and/or the stopper protrusion 116*s* persist. A vane bond pad 710 is on the bottom of the valve vane 116 and is bonded to the cantilever bond pad 122 via a conductive bump 712. The conductive bump 712 may, for example, be a solder bump and/or some other suitable conductive bump.

As seen hereafter, the piezoelectric MEMS valve of FIGS. 7A and 7B may be manufactured at lower cost compared to the piezoelectric MEMS valve of FIGS. 5A and 5B due to a smaller die size. Namely, a die for the piezoelectric MEMS valve of FIGS. 7A and 7B may include the actuator cavity 106, but not the valve cavity 118, whereas a die for the piezoelectric MEMS valve of FIGS. 5A and 5B may include both the actuator cavity 106 and the valve cavity 118. Hence the die for the piezoelectric MEMS valve of FIGS. 7A and 7B is smaller than the die for the piezoelectric MEMS valve of FIGS. 5A and 5B. Because of the smaller die size, more dies may be formed per wafer and manufacturing costs may be lower. Further, because the valve cavity 118 is outside the die for the piezoelectric MEMS valve of FIGS. 7A and 7B, the valve cavity 118 may be larger than it otherwise would be.

Figure 8:
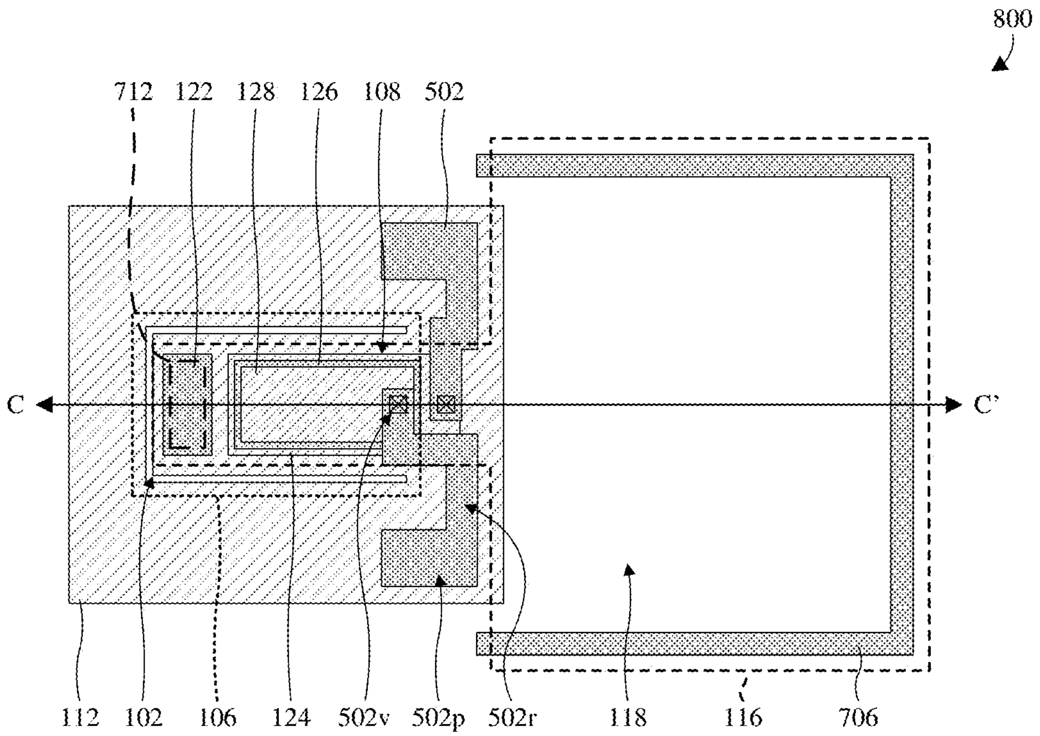
FIG. 8 illustrates a top layout view of some embodiments of the piezoelectric MEMS valve of FIGS. 7A and 7B.

With reference to FIG. 8, a top layout view 800 of some embodiments of the piezoelectric MEMS valve of FIGS. 7A and 7B is provided in the actuated state. The cross-sectional view 700B of FIG. 7B may, for example, be taken along line C-C' in FIG. 8 or along some other suitable line in FIG. 8. Further, several components of the piezoelectric MEMS valve (e.g., the valve vane 116, the actuator cavity 106, and so on) are shown in phantom, and the IMD layer 504 is omitted to show structure that would otherwise be hidden.

The valve cavity 118 is demarcated by the seal 706, as well as the die at which the cantilever 102 and the piezoelectric actuator 108 are arranged. The valve cavity 118 has a rectangular top geometry in which three sides are defined by the seal 706 and another side is defined by the die. In alternative embodiments, the valve cavity 118 may have some other suitable top geometry. Further, in alternative embodiments, the seal 706 may extend in a closed path around the die and/or the valve cavity 118 to reduce valve leakage.

While the top layout view 800 of FIG. 8 corresponds to the actuated state of the piezoelectric MEMS valve illustrated in FIG. 7B, the top layout view 800 is generally applicable to the released state of the piezoelectric MEMS valve illustrated in FIG. 7A. Further, it is to be appreciated that in at least some embodiments, FIGS. 7A, 7B, and 8 all correspond to a common embodiment or common embodiments of the piezoelectric MEMS valve.

Figure 9A:
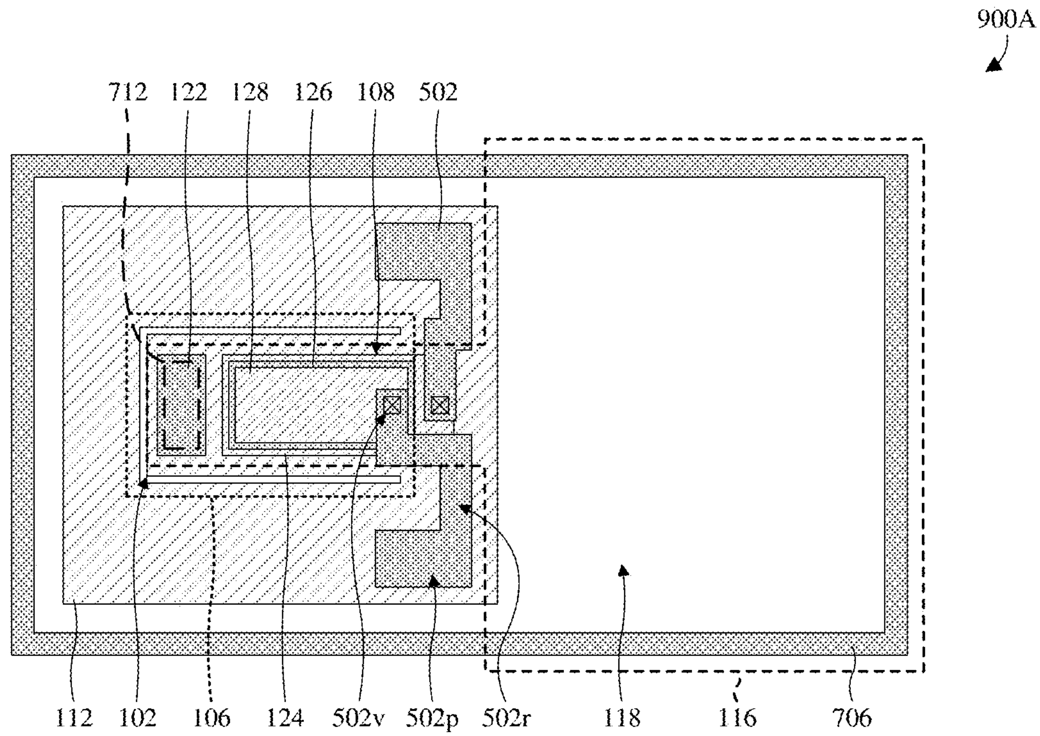
FIGS. 9A-9C illustrate top layout views of some alternative embodiments of the piezoelectric MEMS valve of FIG. 8.
Figure 9B:
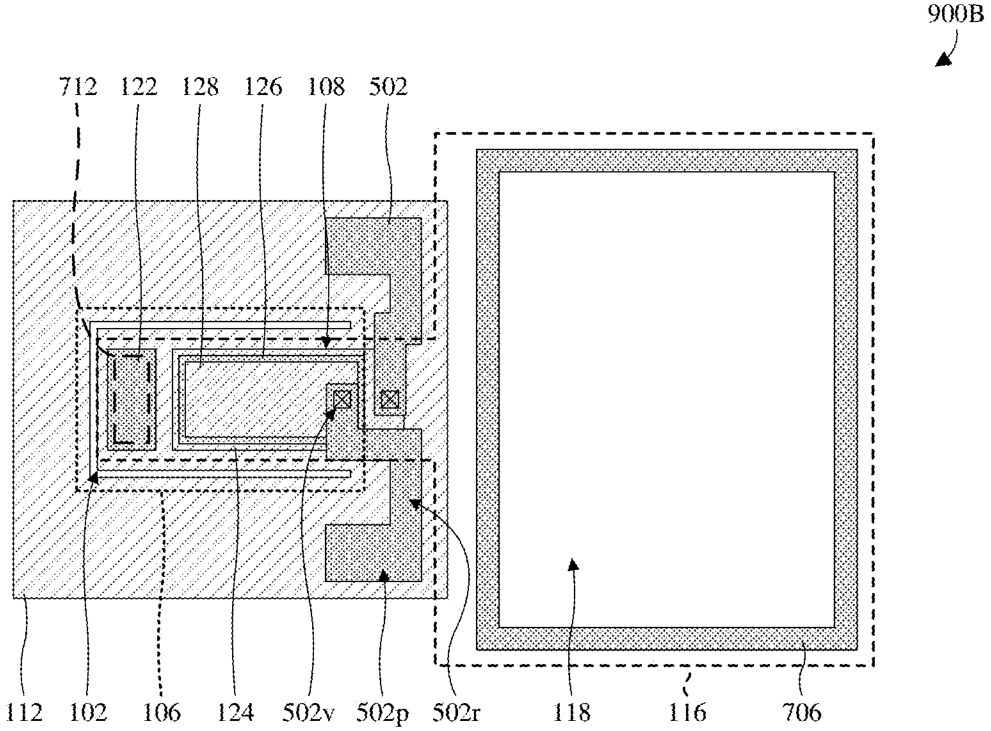
Figure 9C:
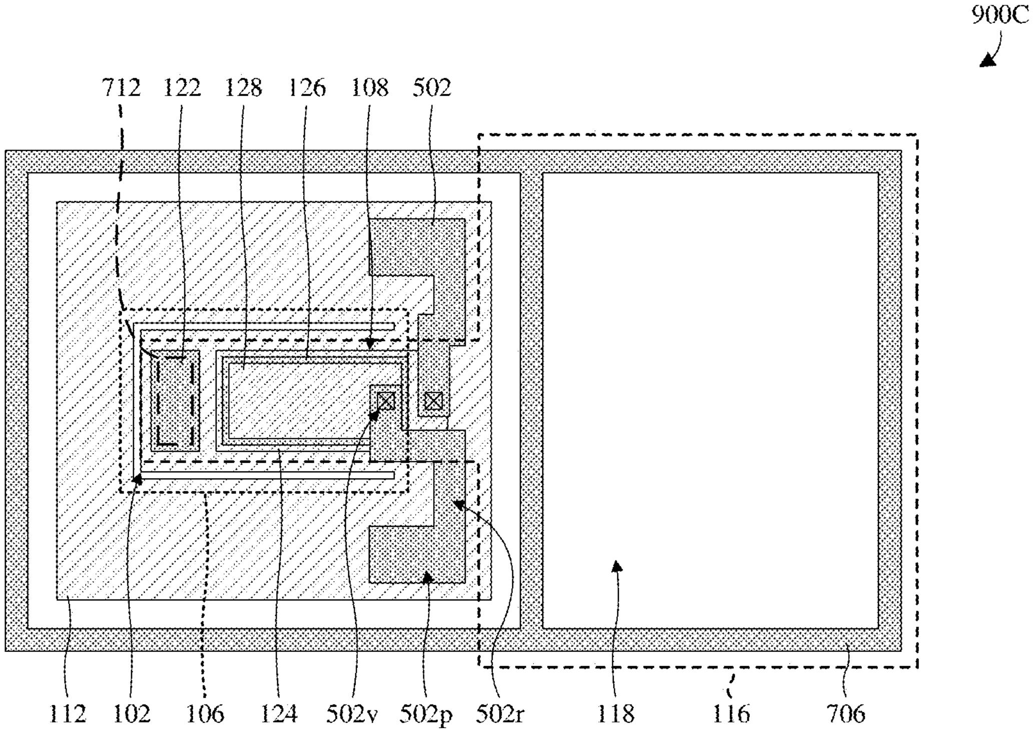

With reference to FIGS. 9A-9C, top layout views 900A-900C of some alternative embodiments of the piezoelectric MEMS valve of FIG. 8 are provided. In FIG. 9A, the seal 706 extends in a closed path around the valve cavity 118, as well as the die at which the cantilever 102 and the piezoelectric actuator 108 are arranged. In FIG. 9B, the seal 706 extends in a closed path around the valve cavity 118, but not the die. In FIG. 9C, the seal 706 extends in a first closed path around the valve cavity 118 and a second, separate closed path around the die.

Figure 10:
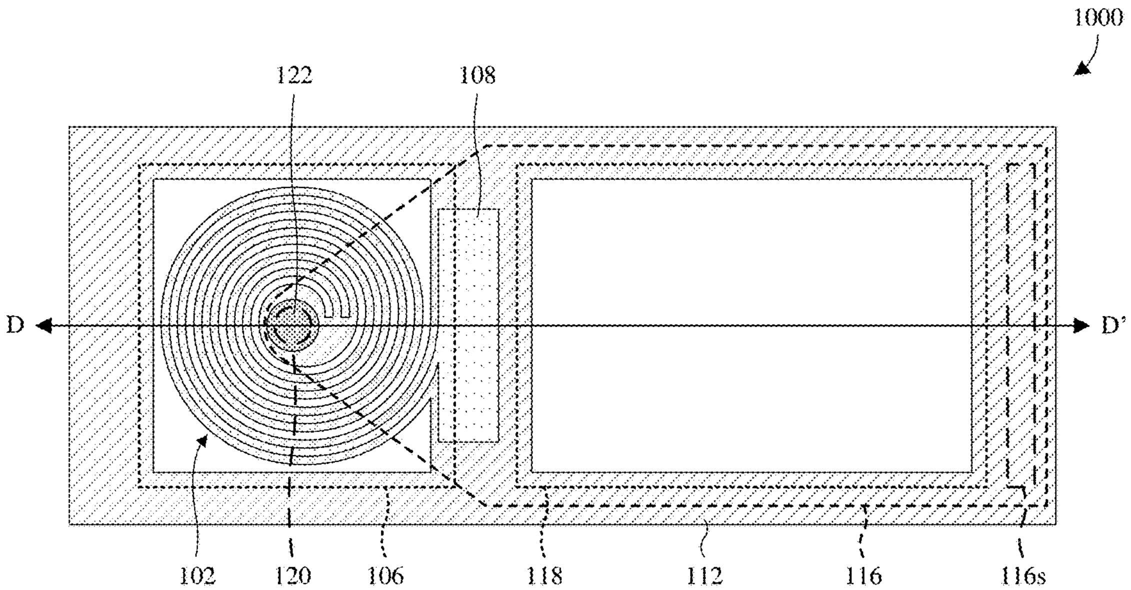
FIG. 10 illustrates a top layout view of some alternative embodiments of the piezoelectric MEMS valve of FIGS. 1A and 1B and/or FIG. 2 in which the piezoelectric MEMS valve has a spiral-shaped cantilever.

With reference to FIG. 10, a top layout view 1000 of some alternative embodiments of the piezoelectric MEMS valve of FIGS. 1A and 1B and/or FIG. 2 is provided in which the cantilever 102 and the piezoelectric actuator 108 are spiral shaped. This is to be contrasted with the beam or lever shape that the cantilever 102 has in FIGS. 1A, 1B, and 2. Note that while not shown for ease of illustration, the piezoelectric actuator 108 comprises the bottom electrode 124, the piezoelectric layer 126, and the top electrode 128 seen in previous figures.

The cantilever 102 has a first end overlapping with and bonded to the substrate (not shown) outside the actuator cavity 106, and further has a second end overlapping the actuator cavity 106. Further, the cantilever 102 spirals inward from the first end to the second end. The piezoelectric actuator 108 overlaps with the cantilever 102 and has a spiral shape similar to the cantilever 102. The valve vane 116 overlaps with and is bonded to the center of the cantilever 102 via the cantilever bond pad 122 and the vane bond pad 120. As such, the valve vane 116 moves with the released and actuated states of the cantilever 102.

Figure 11A:
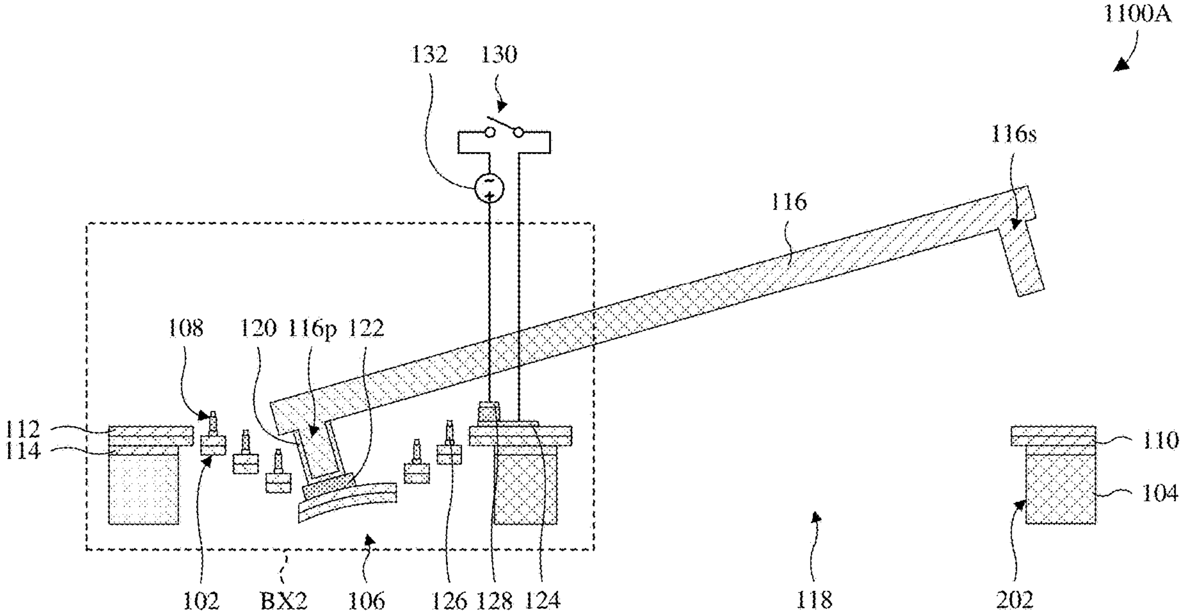
FIGS. 11A and 11B illustrate cross-sectional views of some embodiments of the piezoelectric MEMS valve of FIG. 10 in a released state.
Figure 11B:
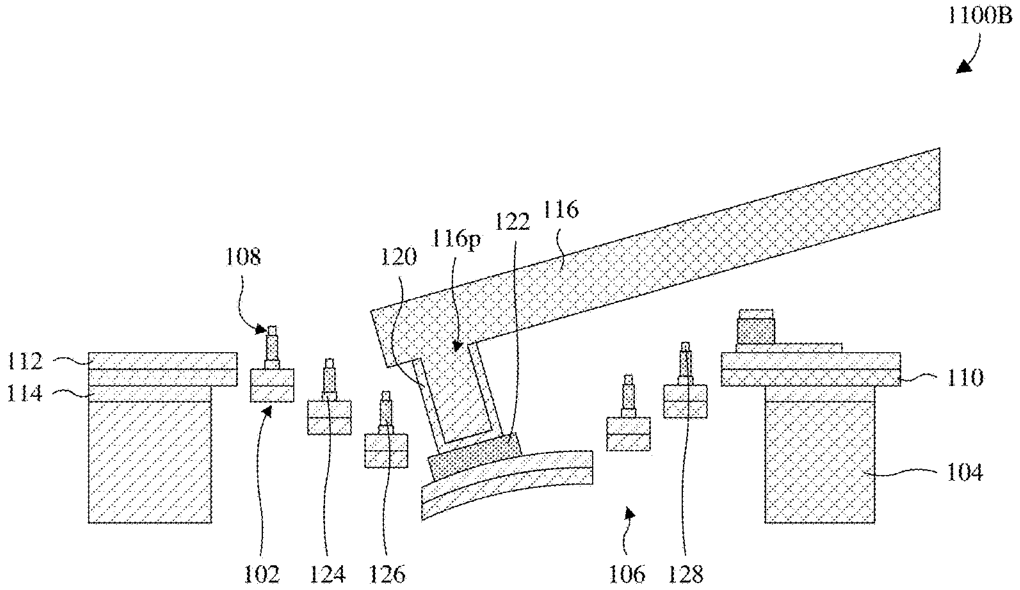

With reference to FIGS. 11A and 11B, cross-sectional views 1100A, 1100B of some embodiments of the piezoelectric MEMS valve of FIG. 10 in a released (e.g., intrinsic or unpowered) state are provided. FIG. 11B provides an enlarged cross-sectional view 1100B of a portion of the piezoelectric MEMS valve within box BX2 of FIG. 11A. Further, the cross-sectional views 1100A, 1100B may, for example, be taken along line D-D' in FIG. 10.

The device dielectric layer 112 and the piezoelectric actuator 108 have residual compressive stress. In some embodiments, the top electrode 128 and the bottom electrode 124 have residual tensile stress, whereas the piezoelectric layer 126 has residual compressive stress that counters and surpasses the residual tensile stress, such that the piezoelectric actuator 108 as a whole has residual compressive stress.

Because of the residual compressive stress, the piezoelectric actuator 108 and the device dielectric layer 112 want to expand. This leads to an outward force along a top of the semiconductor layer 110 that causes the cantilever 102 to intrinsically curve downward. Further, because the piezoelectric MEMS valve is released, there are no external factors to counter the outward force and the curve downward, whereby the cantilever 102 spirals downward from the first end of the cantilever 102 to the second end of the cantilever 102.

Because the cantilever 102 spirals downward to the second end of the cantilever 102, and because the valve vane 116 is bonded to the second end, the valve vane 116 is inclined upward from the pad protrusion 116*p* to the stopper protrusion 116*s*. Further, the stopper protrusion 116*s* is spaced from the wall structure 202 demarcating the valve cavity 118. As a result, the valve cavity 118 is open and fluid may pass through the piezoelectric MEMS valve. Because of the spiral shape of the cantilever 102, the cantilever 102 may be longer for a given area than in the embodiments in FIGS. 1A, 1B, and 2. As a result, the second end of the cantilever 102 may deflect downward more than in the embodiments of FIGS. 1A, 1B, and 2 and the valve vane 116 may be more inclined than in the embodiments of FIGS. 1A, 1B, and 2. This may allow fluid to better pass through the valve cavity 118.

Because of the cantilever 102 spirals downward intrinsically, the piezoelectric MEMS valve is normally open without any external power and/or piping. This leads to low power consumption at least for applications in which a piezoelectric MEMS valve is open more often than closed. Further, as seen hereafter, the piezoelectric MEMS valve may be formed using semiconductor manufacturing processes. This reduces costs and allows a small form factor to be achieved for microfluidics, wearable applications, and so on.

Figure 12:
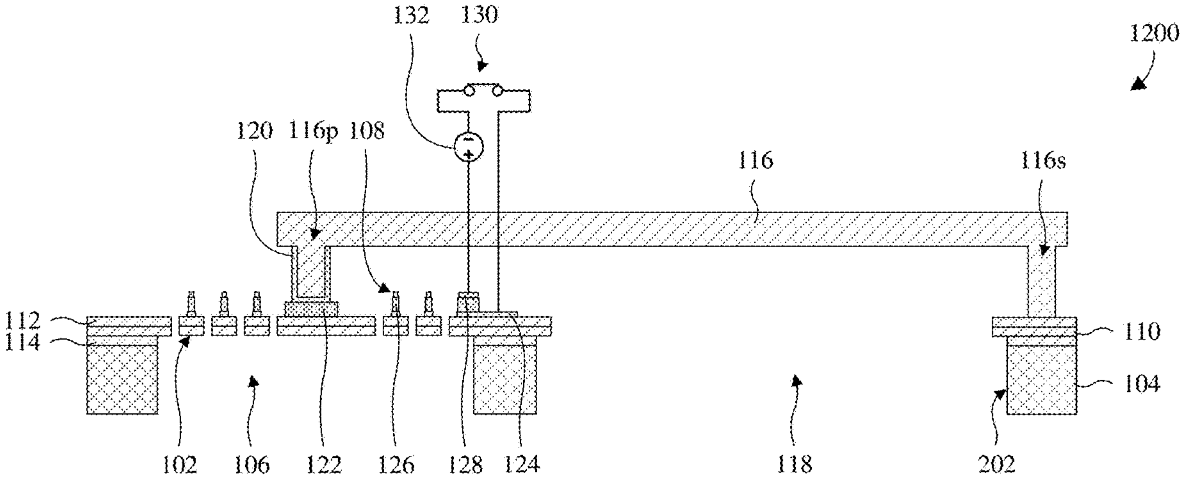
FIG. 12 illustrates a cross-sectional view of some embodiments of the piezoelectric MEMS valve of FIG. 10 in an actuated state.

With reference to FIG. 12, a cross-sectional view 1200 of some embodiments of the piezoelectric MEMS valve of FIG. 10 in an actuated (e.g., powered) state is provided. The cross-sectional view 1200 may, for example, be taken along line D-D' in FIG. 10.

Actuation of the piezoelectric MEMS valve occurs by actuation of the piezoelectric actuator 108. For example, the switch 130 may be closed, thereby electrically coupling the power supply 132 from the top electrode 128 to the bottom electrode 124. Such actuation changes the piezoelectric actuator 108 from compressive stress to tensile stress.

As a result of the actuation and the change from compressive stress to tensile stress, the piezoelectric actuator 108 wants to contract and applies an inward force along a top of the device dielectric layer 112 and the semiconductor layer 110. This counteracts and surpasses the outward force from the device dielectric layer 112, whereby the center of the cantilever 102 moves upward. Further, the cantilever 102 flattens and moves to, or closer to, a planar orientation than in FIGS. 11A and 11B. In some embodiments, the cantilever 102 may further move to an upward spiral rather than a downward spiral.

Because the valve vane 116 is bonded to the center of the cantilever 102, the flattening of the cantilever 102 levels the valve vane 116 and moves the stopper protrusion 116*s* into contact with the wall structure 202. Further, once the stopper protrusion 116*s* comes into contact with the wall structure 202, the valve vane 116 transfers a force from the wall structure 202 to the cantilever 102 that stops further movement of the cantilever 102. With the stopper protrusion 116*s* in contact with the wall structure 202, the valve vane 116 closes the valve cavity 118 so fluid is unable to flow through the piezoelectric MEMS valve.

To return the piezoelectric MEMS valve to open, the piezoelectric actuator 108 may be released. For example, the switch 130 may be opened as in FIGS. 11A and 11B. This reverts the piezoelectric actuator 108 to its intrinsic state in which it is has compressive stress. The compressive stress of the piezoelectric actuator 108 and the compressive stress of the device dielectric layer 112 then causes the cantilever 102 to spiral downward as in FIGS. 11A and 11B.

Figure 13:
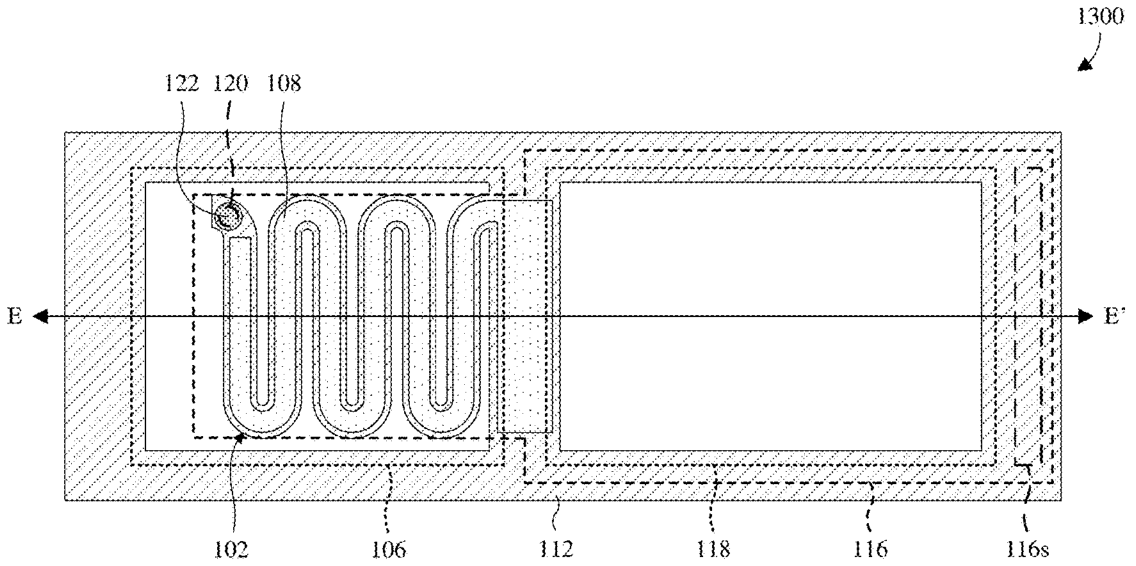
FIG. 13 illustrates a top layout view of some alternative embodiments of the piezoelectric MEMS valve of FIGS. 1A and 1B and/or FIG. 2 in which the piezoelectric MEMS valve has a meandering cantilever.

With reference to FIG. 13, a top layout view 1300 of some alternative embodiments of the piezoelectric MEMS valve of FIGS. 1A and 1B and/or FIG. 2 is provided in which the cantilever 102 and the piezoelectric actuator 108 have meandering shapes. This is to be contrasted with the beam or lever shape that the cantilever 102 has in FIGS. 1A, 1B, and 2. Note that while not shown for ease of illustration, the piezoelectric actuator 108 comprises the bottom electrode 124, the piezoelectric layer 126, and the top electrode 128 seen in previous figures.

The cantilever 102 has a first end overlapping with and bonded to the substrate (not shown) outside the actuator cavity 106, and further has a second end overlapping the actuator cavity 106. Further, the cantilever 102 meanders back and forth along a meandering path, from the first end to the second end, and has a plurality of line-shaped segments elongated in parallel and coupled end to end to form the meandering path. The piezoelectric actuator 108 overlaps with the cantilever 102 and has a meandering shape similar to a meandering shape of the cantilever 102. The valve vane 116 overlaps with and is bonded to the second end of the cantilever 102 via the cantilever bond pad 122 and the vane bond pad 120. As such, the valve vane 116 moves with the released and actuated states of the cantilever 102.

Figure 14A:
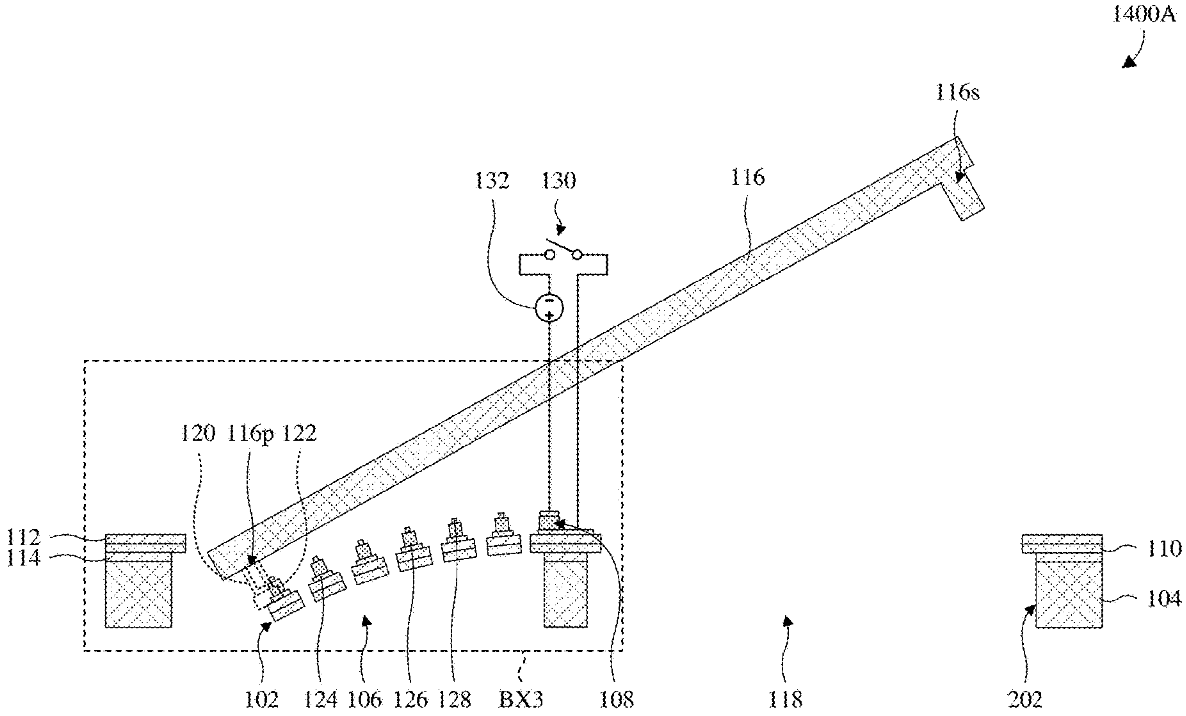
FIGS. 14A and 14B illustrate cross-sectional views of some embodiments of the piezoelectric MEMS valve of FIG. 13 in a released state.
Figure 14B:
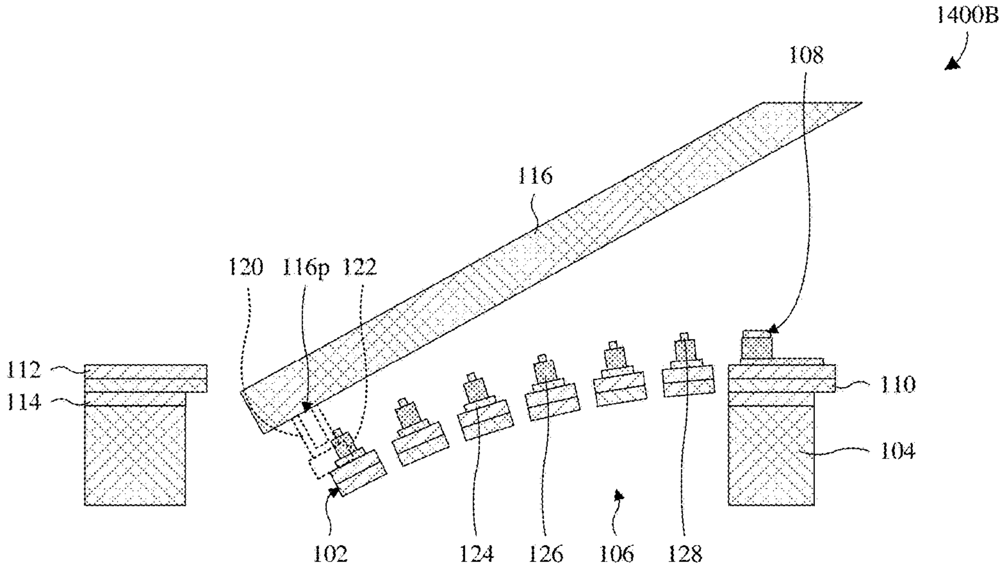

With reference to FIGS. 14A and 14B, cross-sectional views 1400A, 1400B of some embodiments of the piezoelectric MEMS valve of FIG. 13 in a released (e.g., intrinsic or unpowered) state are provided. FIG. 14B provides an enlarged cross-sectional view 1400B of a portion of the piezoelectric MEMS valve within box BX3 of FIG. 14A. Further, the cross-sectional views 1400A, 1400B may, for example, be taken along line E-E' in FIG. 13.

Similar to previous embodiments, the device dielectric layer 112 and the piezoelectric actuator 108 have residual compressive stress. In some embodiments, the top electrode 128 and the bottom electrode 124 have residual tensile stress, whereas the piezoelectric layer 126 has residual compressive stress that counters and surpasses the residual tensile stress, such that the piezoelectric actuator 108 as a whole has residual compressive stress.

Because of the residual compressive, the cantilever 102 curves downward along the meandering path of the cantilever 102. This inclines the valve vane 116 upward from the pad protrusion 116*p* and spaces the valve vane 116 from the wall structure 202 to open the valve cavity 118. As a result, the piezoelectric MEMS valve is open, and fluid may pass through the valve cavity 118 unimpeded. Because of the meandering shape of the cantilever 102, the cantilever 102 may be longer for a given area than in the embodiments in FIGS. 1A, 1B, and 2. As a result, the second end of the cantilever 102 may deflect downward more than in the embodiments of FIGS. 1A, 1B, and 2 and the valve vane 116 may be more inclined. This may allow fluid to better pass through the valve cavity 118.

Figure 15:
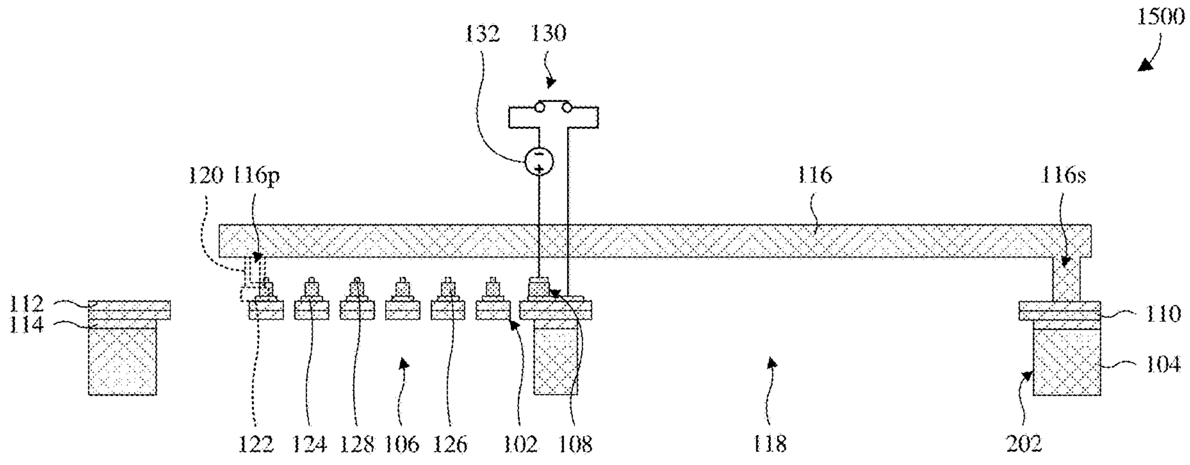
FIG. 15 illustrates a cross-sectional view of some embodiments of the piezoelectric MEMS valve of FIG. 13 in an actuated state.

With reference to FIG. 15, a cross-sectional view 1500 of some embodiments of the piezoelectric MEMS valve of FIG. 13 in an actuated (e.g., powered) state is provided. The cross-sectional view 1500 may, for example, be taken along line E-E' in FIG. 13.

Actuation of the piezoelectric MEMS valve occurs by actuation of the piezoelectric actuator 108. For example, the switch 130 may be closed, thereby electrically coupling the power supply 132 from the top electrode 128 to the bottom electrode 124. Such actuation changes the piezoelectric actuator 108 from compressive stress to tensile stress. As a result of the actuation and the change from compressive stress to tensile stress, the piezoelectric actuator 108 wants to contract and applies an inward force along a top of the device dielectric layer 112 and the semiconductor layer 110. This counteracts and surpasses the outward force from the device dielectric layer 112, whereby the cantilever 102 flattens and moves to, or closer to, a planar orientation than in FIGS. 14A and 14B.

Because the valve vane 116 is bonded to the cantilever 102, the flattening of the cantilever 102 levels the valve vane 116 and moves the stopper protrusion 116*s* into contact with the wall structure 202. Further, once the stopper protrusion 116*s* comes into contact with the wall structure 202, the valve vane 116 transfers a force from the wall structure 202 to the cantilever 102 that stops further movement of the cantilever 102. With the stopper protrusion 116*s* in contact with the wall structure 202, the valve vane 116 closes the valve cavity 118 so fluid is unable to flow through the piezoelectric MEMS valve.

To return the piezoelectric MEMS valve to open, the piezoelectric actuator 108 may be released. For example, the switch 130 may be opened as in FIGS. 14A and 14B. This reverts the piezoelectric actuator 108 to its intrinsic state, as seen in FIGS. 14A and 14B, to open the piezoelectric MEMS valve.

With reference to FIGS. 16-35, a series of cross-sectional views 1600-3500 of some first embodiments of a method for forming a piezoelectric MEMS valve is provided. The piezoelectric MEMS valve may, for example, be the piezoelectric MEMS valve in FIGS. 5A, 5B, and 6 or some other suitable piezoelectric MEMS valve. Further, the piezoelectric MEMS valve may, for example, correspond to a die, a chip, or the like.

Figure 16:
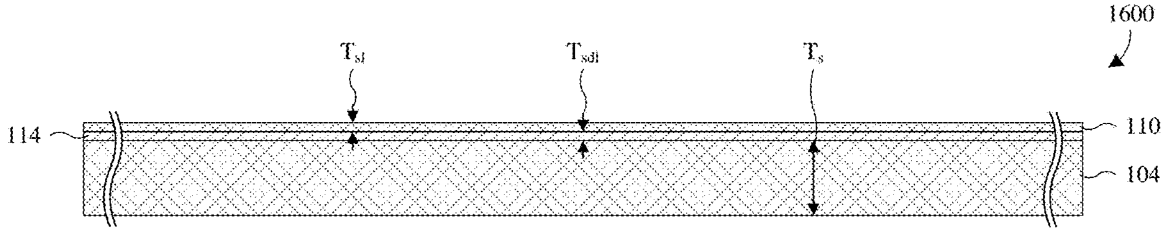
FIGS. 16-35 illustrate a series of cross-sectional views of some first embodiments of a method for forming a piezoelectric MEMS valve.

As illustrated by the cross-sectional view 1600 of FIG. 16, a semiconductor structure comprising a substrate 104, a substrate dielectric layer 114, and a semiconductor layer 110 may be provided or otherwise formed. The substrate dielectric layer 114 overlies the substrate 104, and the semiconductor layer 110 overlies the substrate dielectric layer 114.

In some embodiments, the substrate 104, the substrate dielectric layer 114, and the semiconductor layer 110 correspond to a monocrystalline silicon-on-insulator (SOI) wafer or substrate, a polysilicon-on-insulator (POI) wafer or substrate, two bonded wafers or substrates bonded tother via a dielectric layer, or like. The substrate 104 may, for example, also be known as a device wafer, a device substrate, or the like. The substrate dielectric layer 114 may, for example, also be known as a buried oxide layer, a buried dielectric layer, or the like. The semiconductor layer 110 may, for example, also be known as a device layer or the like.

In some embodiments, the substrate 104 is or comprises silicon and/or some other suitable substrate material(s), and/or has a thickness Ts that is about 200-1000 micrometers or some other suitable value. In some embodiments, the substrate dielectric layer 114 is or comprises silicon oxide (e.g., $SiO_2$) and/or some other suitable dielectric(s), and/or has a thickness $T_{sdl}$ that is about 0.1-5 micrometers angstroms or some other suitable value. In some embodiments, the semiconductor layer 110 is or comprises monocrystalline silicon, polysilicon, some other suitable semiconductor material(s), or any combination of the foregoing, and/or has a thickness $T_{sl}$ that is about 0.1-50 micrometers angstroms or some other suitable value.

Figure 17:
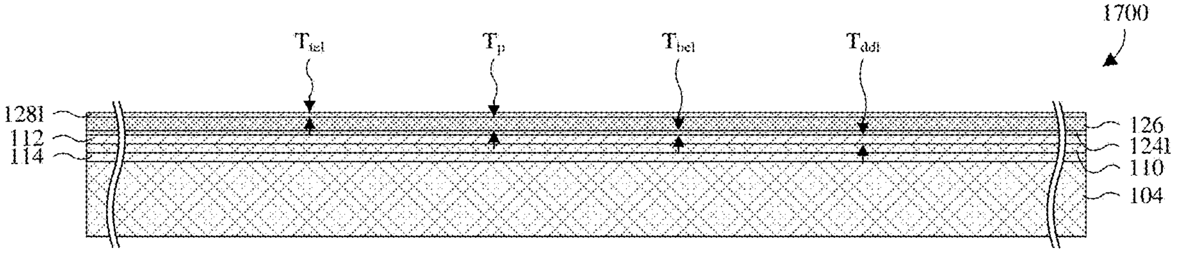

As illustrated by the cross-sectional view 1700 of FIG. 17, a device dielectric layer 112 is deposited overlying the semiconductor layer 110 and then an actuator film is deposited overlying the device dielectric layer 112. The actuator film comprises a bottom electrode layer 1241, a piezoelectric layer 126 overlying the bottom electrode layer 1241, and a top electrode layer 1281 overlying the piezoelectric layer 126.

Materials of the device dielectric layer 112 and the actuator film are selected so as to have a combined residual stress that is compressive. For example, the device dielectric layer 112 and the piezoelectric layer 126 may have individual residual compressive stresses, and the bottom electrode layer 1241 and the top electrode layer 1281 may have individual residual tensile stresses that are counteracted and surpassed by the residual compressive stresses. As a result, the device dielectric layer 112 and the actuator film want to expand and hence apply an outward force along a top surface of the semiconductor layer 110. As seen hereafter, this leads to an intrinsic downward curve of a cantilever hereafter formed.

In some embodiments, the device dielectric layer 112 is deposited by thermal oxidation (THOX), chemical vapor deposition (CVD), atomic layer deposition (ALD), physical vapor deposition (PVD), some other suitable deposition process, or any combination of the foregoing. Further, in some embodiments, the device dielectric layer 112 is or comprises silicon oxide (e.g., $SiO_2$), titanium oxide (e.g., $TiO_2$), some other suitable dielectrics(s), or any combination of the foregoing. Further yet, in some embodiments, the device dielectric layer 112 has a thickness $T_{ddl}$ that is about 1000-10000 angstroms or some other suitable value.

In some embodiments, the bottom electrode layer 1241 is deposited by PVD and/or some other suitable deposition process. Further, in some embodiments, the bottom electrode layer 1241 is or comprises platinum and/or some other suitable conductive materials, and/or has a thickness $T_{bel}$ that is about 500-10000 angstroms or some other suitable value. In some embodiments, the top electrode layer 1281 is deposited by PVD and/or some other suitable deposition process. Further, in some embodiments, the top electrode layer 1281 is or comprises platinum, ruthenium, some other suitable conductive material(s), or any combination of the foregoing. Further yet, in some embodiments, the top electrode layer 1281 has a thickness $T_{tel}$ that is about 500-100000 angstroms or some other suitable value.

In some embodiments, the piezoelectric layer 126 is deposited by PVD and/or some other suitable deposition process. Further, in some embodiments, the piezoelectric layer 126 is or comprises sol-gel, PZT, some other suitable piezoelectric material(s), or any combination of the foregoing. Further yet, in some embodiments, the piezoelectric layer 126 has a thickness $T_p$ that is about 2000-50000 angstroms or some other suitable value.

Figure 18:
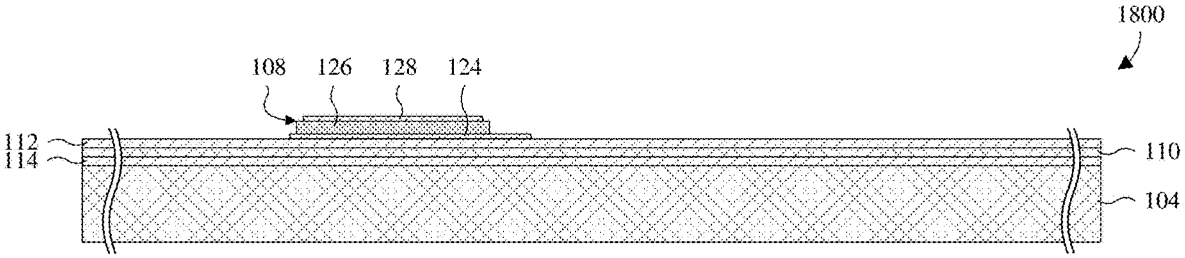

As illustrated by the cross-sectional view 1800 of FIG. 18, the top electrode layer 1281, the piezoelectric layer 126, and the bottom electrode layer 1241 are patterned into a piezoelectric actuator 108. The piezoelectric actuator 108 comprises a portion of the bottom electrode layer 1241, which is hereafter referred to as a bottom electrode 124, and a portion of the piezoelectric layer 126 overlying the bottom electrode 124. Further, the piezoelectric actuator 108 comprises a portion of the top electrode layer 1281, which is hereafter referred to as a top electrode 128 and which overlies the piezoelectric layer 126.

The patterning may, for example, comprise selectively etching the top electrode layer 1281 using a photolithography/etching process with a first mask, then selectively etching the piezoelectric layer 126 using a photolithography/etching process with a second mask, and then selectively etching the bottom electrode layer 1241 using a photolithography/etching process with a third mask. Each etching step may, for example, be performed by reactive ion etching (RIE), ion beam etching, aqua regia etching, or some other suitable etching process.

Figure 19:
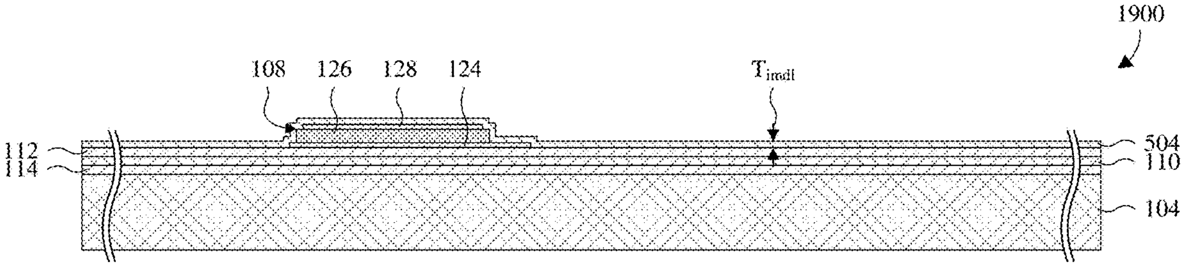

As illustrated by the cross-sectional view 1900 of FIG. 19, an IMD layer 504 is deposited over the device dielectric layer 112 and the piezoelectric actuator 108. In some embodiments, the IMD layer 504 has residual compressive stress, similar to the device dielectric layer 112. In some embodiments, the IMD layer 504 is deposited by CVD and/or some other suitable deposition process. In some embodiments, the IMD layer 504 is or comprises aluminum oxide (e.g., $Al_2O_3$), silicon oxide (e.g., $SiO_2$), silicon nitride (e.g., $Si_3N_4$), some other suitable dielectric(s), or any combination of the foregoing. In some embodiments, a thickness $T_{imdl}$ of the IMD layer 504 is or comprises 1000-5000 angstroms or some other suitable value.

Figure 20:
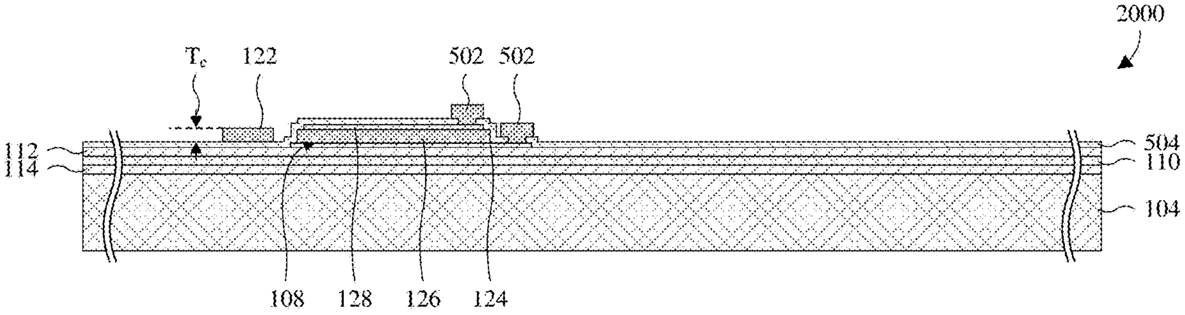

As illustrated by the cross-sectional view 2000 of FIG. 20, a cantilever bond pad 122 and a pair of IO structures 502 are formed. The cantilever bond pad 122 is formed overlying the IMD layer 504, laterally adjacent to the piezoelectric actuator 108. The pair of IO structures 502 are formed overlying the IMD layer 504 and the piezoelectric actuator 108. Further, the pair of IO structures 502 are formed protruding through the IMD layer 504 respectively to the bottom and top electrodes 124, 128. A top layout of the cantilever bond pad 122 and of the pair of IO structures 502 may, for example, be as shown and described with regard to FIG. 6.

In some embodiments, a passivation layer (not shown) is further deposited over the cantilever bond pad 122 and the pair of IO structures 502 and is then patterned to form openings exposing the cantilever bond pad 122 and the pair of IO structures 502. In some embodiments, a process for forming the cantilever bond pad 122 and the pair of IO structures 502 comprises patterning the IMD layer 504 to form via openings overlying and respectively exposing the bottom and top electrodes 124, 128. A conductive layer is deposited overlying the IMD layer 504 and filling the via openings and is patterned into the cantilever bond pad 122 and the pair of IO structures 502. The patterning to form the via openings may, for example, be performed by a dry etch, a buffered oxide etch (BOE), some suitable etch, or any combination of the foregoing. The patterning of the conductive layer may, for example, be performed by an ion beam etch, a dry metal etch, a wet metal etch, some suitable etch, or any combination of the foregoing.

In some embodiments, the conductive layer is or comprises gold, aluminum copper, copper, some other suitable conductive material(s), or any combination of the foregoing. In some embodiments, the conductive layer is deposited by PVD and/or some other suitable deposition process. In some embodiments, a thickness $T_c$ of the conductive layer is or comprises 3000-8000 angstroms or some other suitable value.

Figure 21:
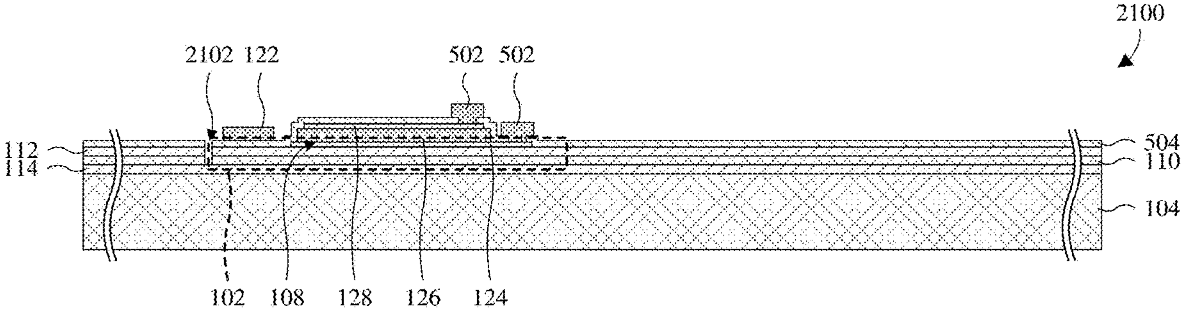

As illustrated by the cross-sectional view 2100 of FIG. 21, the IMD layer 504, the device dielectric layer 112, and the semiconductor layer 110 are patterned to form a cantilever opening 2102 that demarcates a cantilever 102. In some embodiments, the cantilever 102 has a top layout as in FIG. 6. In other embodiments, the cantilever 102 has a top layout as in FIG. 10 or 13. The patterning may, for example, be performed by a series of one or more etches and may, for example, use the substrate dielectric layer 114 as an etch stop.

Figure 22:
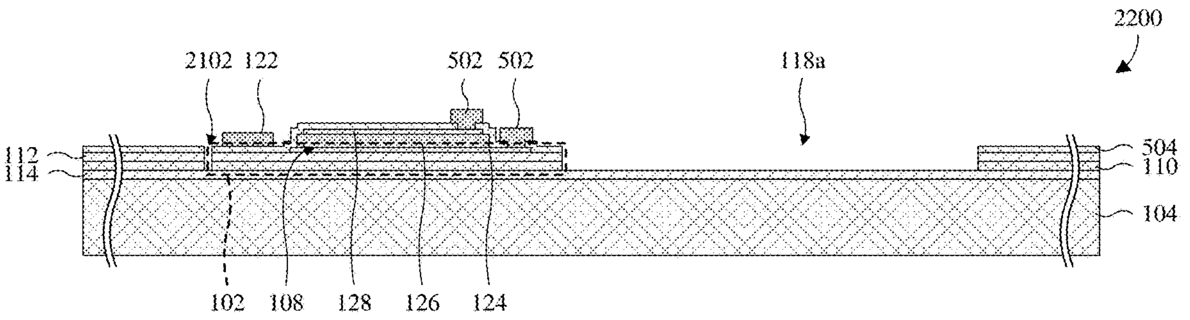

As illustrated by the cross-sectional view 2200 of FIG. 22, the IMD layer 504, the device dielectric layer 112, and the semiconductor layer 110 are patterned to demarcate a valve cavity area 118*a* on an opposite side of the piezoelectric actuator 108 as the cantilever bond pad 122. The patterning is performed separate from the patterning to form the cantilever opening 2102 due to different process loading (e.g., etch loading or the like). Further, the patterning may, for example, be performed by a series of one or more etches and may, for example, use the substrate dielectric layer 114 as an etch stop.

Figure 23:
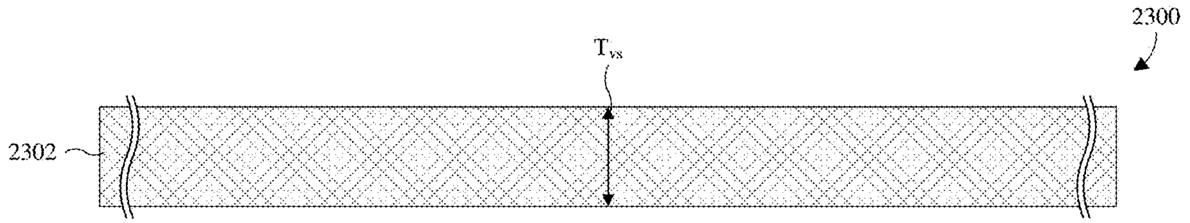

As illustrated by the cross-sectional view 2300 of FIG. 23, a vane substrate 2302 is provided. In some embodiments, the vane substrate 2302 is or comprises silicon and/or some other suitable substrate material(s), and/or the vane substrate 2302 corresponds to a semiconductor wafer or the like. In some embodiments, a thickness $T_v$s of the vane substrate 2302 is about 735 micrometers or some other suitable value.

Figure 24:
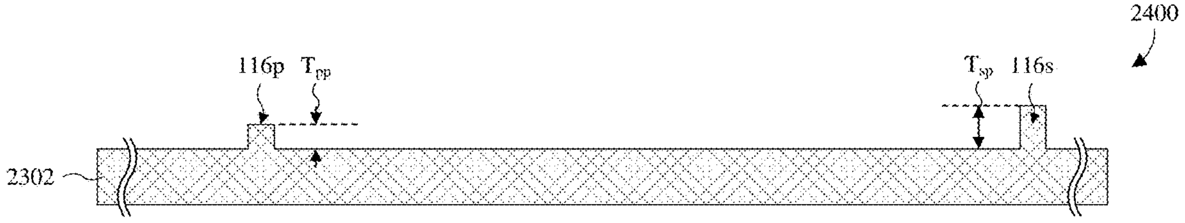

As illustrated by the cross-sectional view 2400 of FIG. 24, the vane substrate 2302 is patterned to form a pad protrusion 116*p* and a stopper protrusion 116*s*. The patterning may, for example, be performed by selectively etching the vane substrate 2302 using one or more photolithography/etching processes. Other suitable patterning processes are, however, amenable. The etching may, for example, be performed by a Bosh dry etch and/or the like.

The pad protrusion 116*p* has a height $T_{pp}$ that is smaller than a height $T_{sp}$ of the stopper protrusion 116*s*. However, the height $T_{pp}$ of the pad protrusion 116*p* may alternatively be larger than or otherwise the same as the height $T_{sp}$ of the stopper protrusion 116*s*. In some embodiments, the height $T_{pp}$ of the pad protrusion 116*p* is about 1-10 micrometers or some other suitable value. In some embodiments, the height $T_{sp}$ of the stopper protrusion 116*s* is about 1-10 micrometers or some other suitable value.

Figure 25:
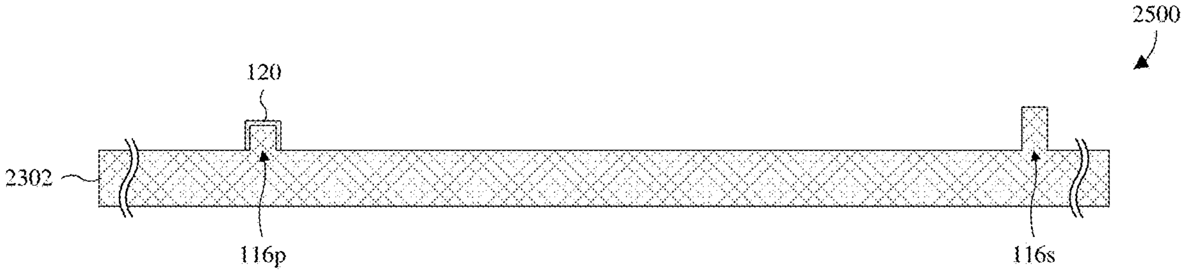

As illustrated by the cross-sectional view 2500 of FIG. 25, a vane bond pad 120 is formed on the pad protrusion 116*p*. In some embodiments, the vane bond pad 120 is or comprises a eutectic bonding material, a fusion bonding material, some other suitable bonding material(s), or any combination of the foregoing. For example, the vane bond pad 120 may be or comprise gold, germanium, silicon, or the like.

A process for forming the vane bond pad 120 may, for example, comprise depositing a conductive layer over and lining the vane substrate 2302 and subsequently patterning the conductive layer into the vane bond pad 120. The patterning may, for example, be performed by a photolithography/etching process or some other suitable patterning process.

Figure 26:
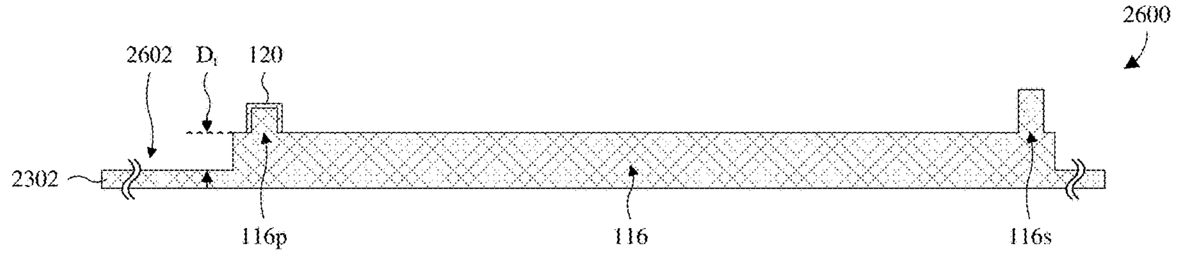

As illustrated by the cross-sectional view 2600 of FIG. 26, the vane substrate 2302 is patterned to form a trench 2602 demarcating a valve vane 116 at the pad protrusion 116*p* and the stopper protrusion 116*s*. The patterning may, for example, be performed by a photolithography/etching process or some other suitable patterning process. The etching may, for example, be performed by Bosh etching, deep reactive ion etching (DRIE), some other suitable etching process, or any combination of the foregoing. In some embodiments, a depth $D_t$ of the trench 2602 is about 10-300 micrometers or some other suitable value.

Figure 27:
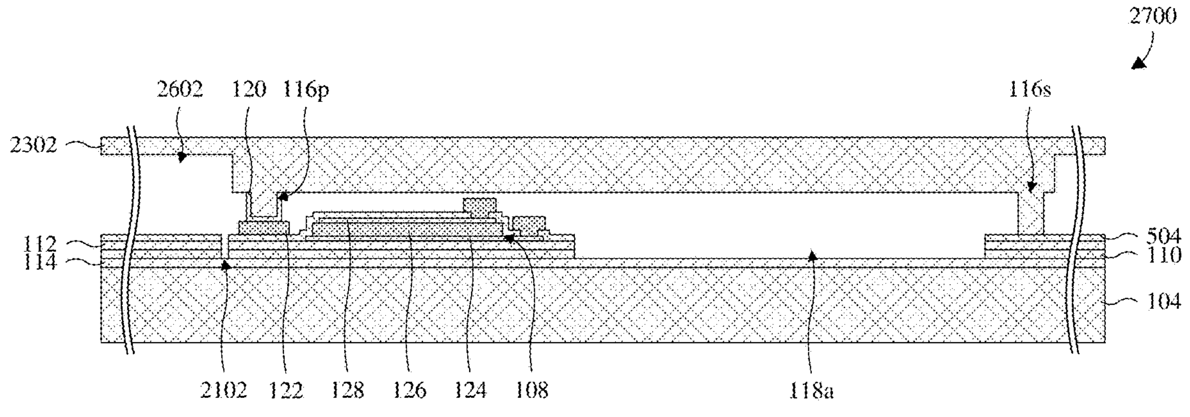

As illustrated by the cross-sectional view 2700 of FIG. 27, the vane substrate 2302 is vertically flipped and bonded to the semiconductor structure of FIG. 22. Such bonding includes bonding the cantilever bond pad 122 to the vane bond pad 120 by fusion bonding, eutectic bonding, or some other suitable type of bonding. In some embodiments, the stopper protrusion 116*s* further comes into contact with the IMD layer 504 but does not bond to the IMD layer 504.

Figure 28:
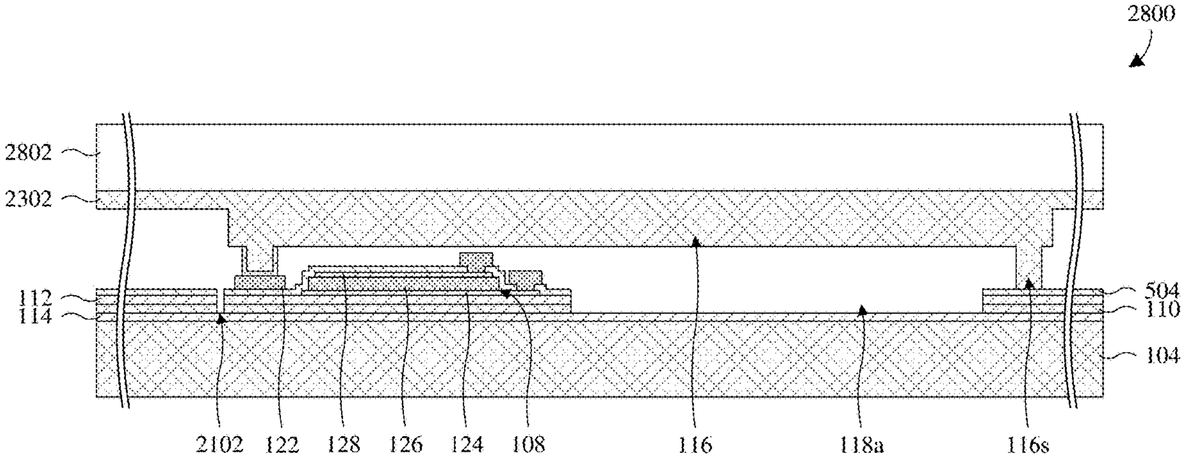

As illustrated by the cross-sectional view 2800 of FIG. 28, a carrier substrate 2802 is bonded to a top of the vane substrate 2302. The bonding may, for example, be performed by an adhesive, fusion bonding, or some other suitable type of bonding.

Figure 29:
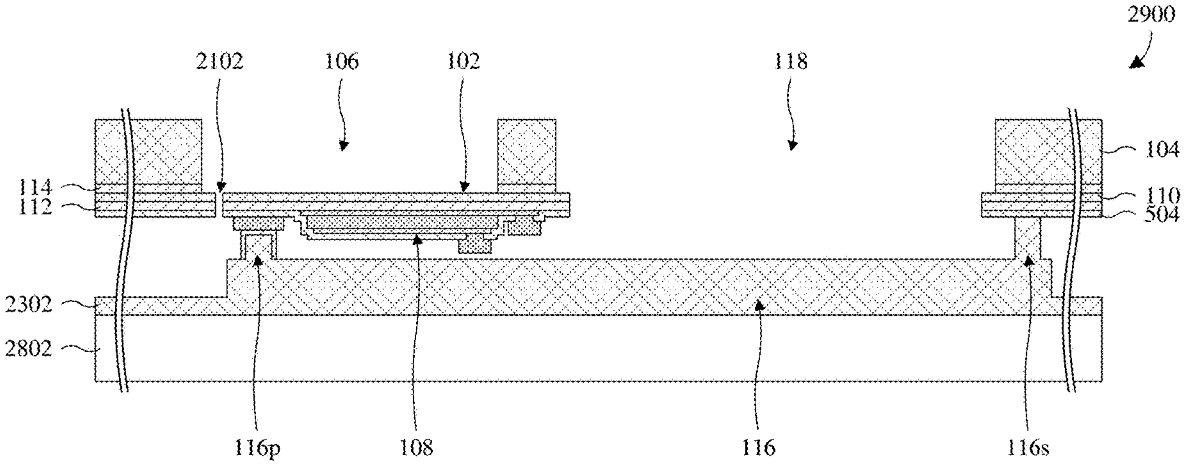

As illustrated by the cross-sectional view 2900 of FIG. 29, the structure of FIG. 28 is vertically flipped. Further, the substrate 104 is thinned (e.g., reduced in thickness) and is then patterned to form an actuator cavity 106 and a valve cavity 118 extending through the substrate 104 and the substrate dielectric layer 114. The actuator cavity 106 overlaps with the piezoelectric actuator 108 and the cantilever 102. The valve cavity 118 is laterally spaced from the actuator cavity 106 and is at the valve cavity area 118*a* (see, e.g., FIG. 22).

The thinning may, for example, be performed by grinding, a chemical mechanical polish (CMP), the like, or any combination of the foregoing. The patterning may, for example, be performed by a photolithography/etching process or some other suitable patterning process. The etching may, for example, be performed by Bosh etching, DRIE, some other suitable etching process, or any combination of the foregoing. In some embodiments, the substrate dielectric layer 114 serves as an etch stop during the etching. Further, in some embodiments, the actuator cavity 106 and the valve cavity 118 are formed by different patterning processes (e.g., by different photolithography/etching processes with different masks).

Figure 30:
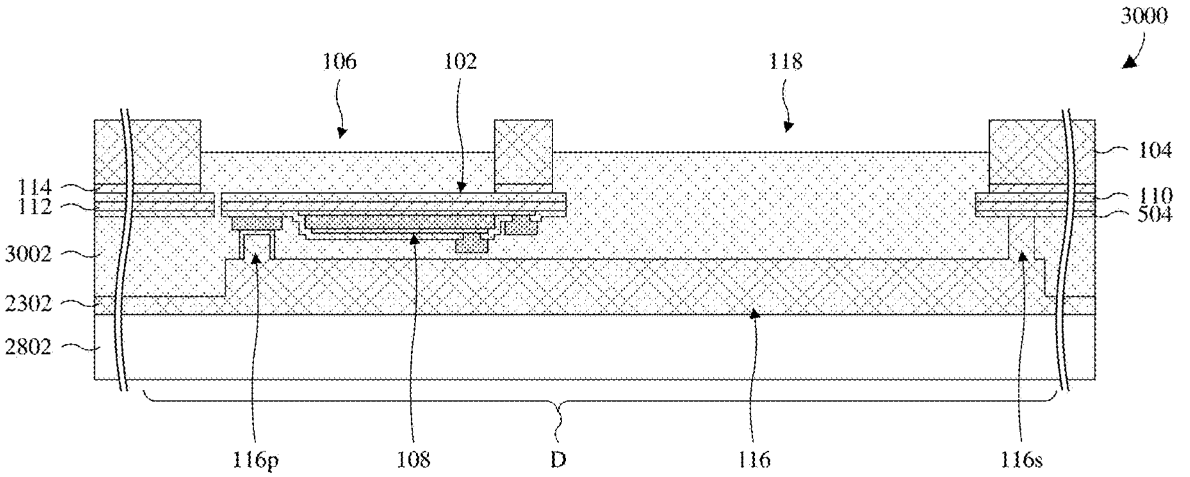

As illustrated by the cross-sectional view 3000 of FIG. 30, a sacrificial layer 3002 is deposited around the cantilever 102 and the valve vane 116 and further partially filling the actuator cavity 106 and the valve cavity 118. The sacrificial layer 3002 holds the cantilever 102 and the valve vane 116 in place during subsequent processing and may, for example, be or comprise an epoxy and/or some other suitable material.

Collectively, the cantilever 102, the piezoelectric actuator 108, the valve vane 116, the actuator cavity 106, and the valve cavity 118 form or otherwise correspond to a MEMS die D. The MEMS die D may, for example, also be known as a MEMS chip or the like. Further, the MEMS die D may repeat in a grid-shaped pattern or some other suitable pattern outside the cross-sectional view 3000, such that there are multiple instances of the MEMS die D. These multiple instances may be concurrently formed according to the acts of FIGS. 16-30.

Figure 31:
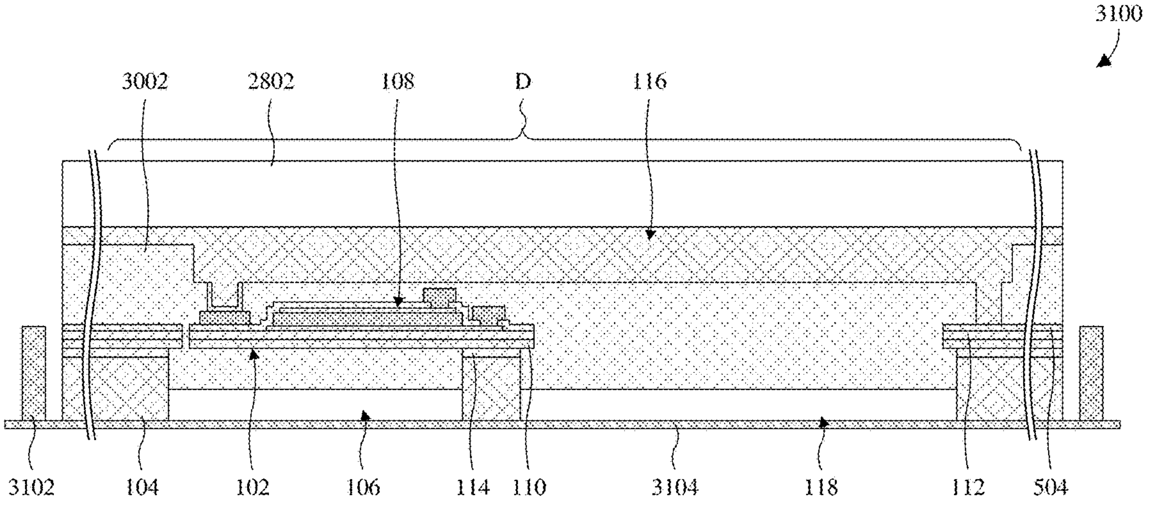

As illustrated by the cross-sectional view 3100 of FIG. 31, the structure of FIG. 30 is vertically flipped and is taped to a tape frame 3102 with frame tape 3104. The tape frame 3102 may, for example, facilitate dicing or singulation of the MEMS die D.

Figure 32:
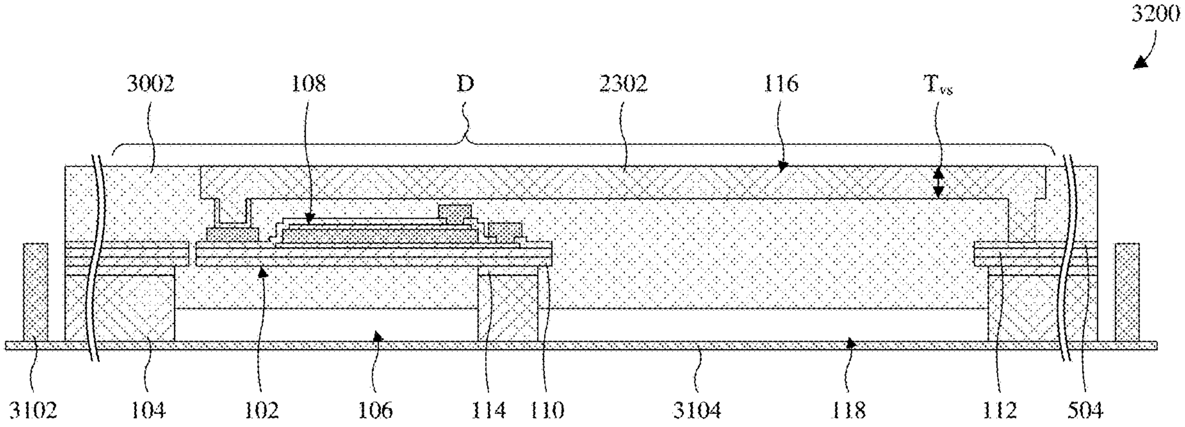

As illustrated by the cross-sectional view 3200 of FIG. 32, the carrier substrate 2802 is removed from the vane substrate 2302. Further, the vane substrate 2302 is thinned to expose the sacrificial layer 3002. This has the effect of separating the valve vane 116 from repetitions of the valve vane 116 formed in the vane substrate 2302 outside the cross-sectional view 3200. In some embodiments, after the thinning, the thickness $T_{vs}$ of the vane substrate 2302 is about 10-300 micrometers or some other suitable value. The thinning may, for example, be performed by grinding and/or etching. The grinding may, for example, be performed by a CMP and/or the like. The etching may, for example, be performed by DRIE and/or the like.

Figure 33:
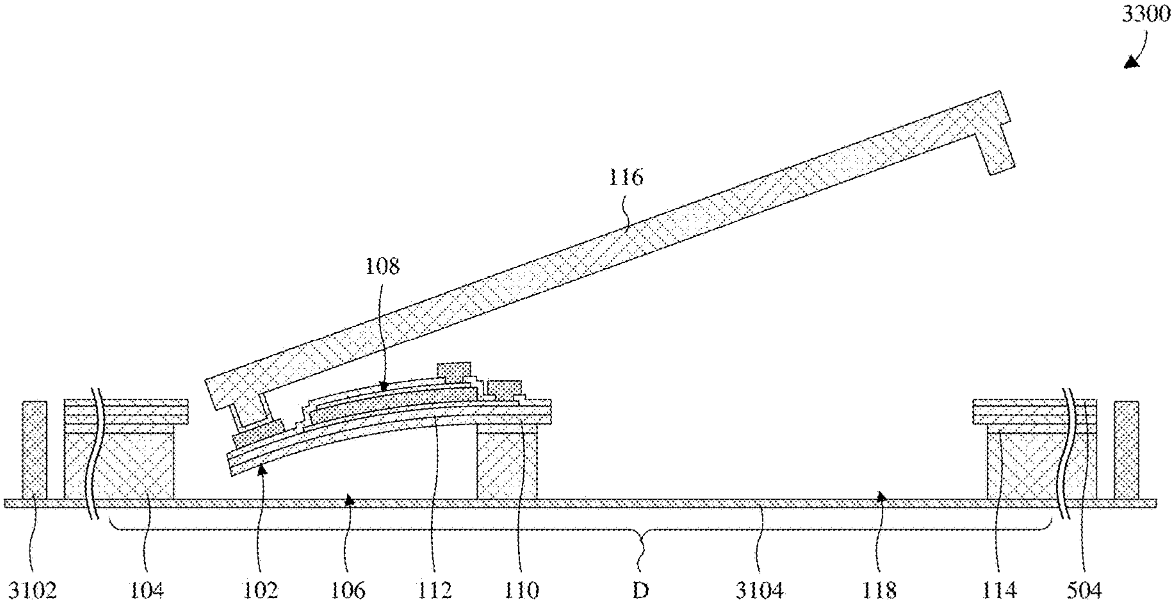

As illustrated by the cross-sectional view 3300 of FIG. 33, the sacrificial layer 3002 is removed. The removal may, for example, be performed by plasma ashing and/or some other suitable removal process. Removing the sacrificial layer 3002 releases the cantilever 102, whereby it reverts to its intrinsic and/or unpowered state.

As noted above, the piezoelectric actuator 108 and the device dielectric layer 112 have residual compressive stress. Further, in some embodiments, the IMD layer 504 has residual compressive stress. Layers and/or structures under residual compressive stress want to expand and hence apply outward force to adjoining layers and/or structures. This outward force from the piezoelectric actuator 108, the device dielectric layer 112, and, in some embodiments, the IMD layer 504 is transferred to a top of the semiconductor layer 110, which causes the cantilever 102 to curve downward. Further, because the valve vane 116 is bonded to the cantilever 102, this curve downward inclines the valve vane 116 and opens the valve cavity 118.

During use of the piezoelectric MEMS valve, actuation of the piezoelectric actuator 108 counters the outward force from the residual compressive stress and the cantilever 102 curves upward. The curve upward declines or levels the valve vane 116 until the stopper protrusion 116*s* comes into contact with the IMD layer 504 at a periphery of the valve cavity 118. Further, the curve upward closes the valve cavity 118, thereby preventing fluid from passing through the valve cavity 118. FIG. 5B provides additional detail.

Figure 34:
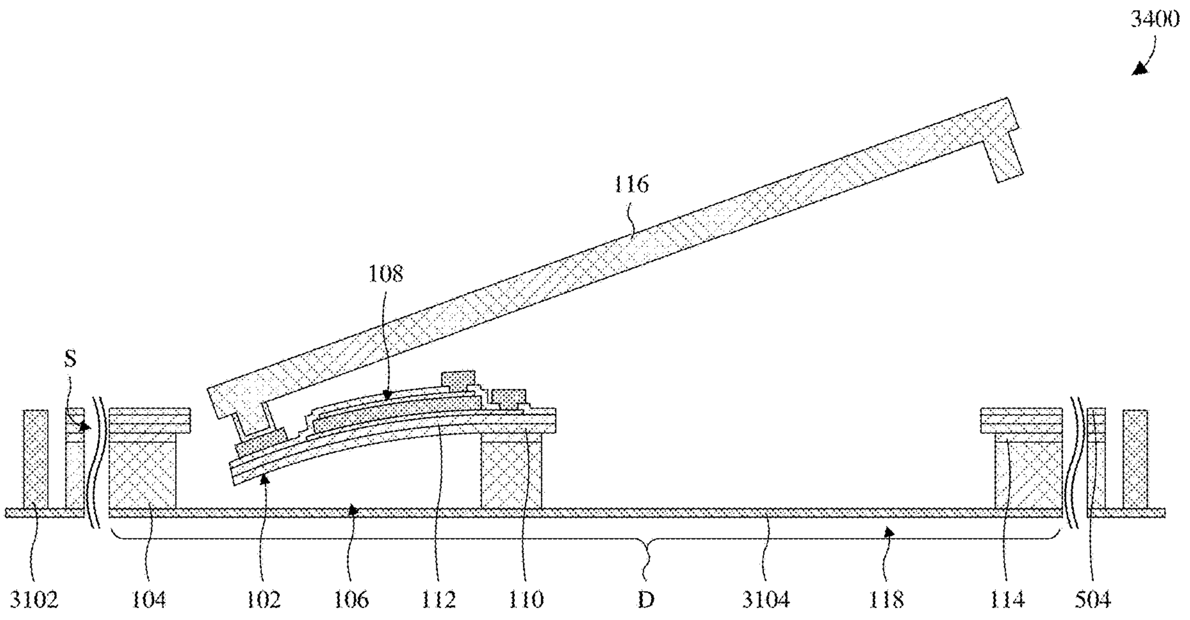

As illustrated by the cross-sectional view 3400 of FIG. 34, the semiconductor structure of FIG. 33 undergoes dicing to separate the MEMS die D from repetitions of the MEMS die D. The dicing may, for example, be performed by removing material at scribe-line regions S of the semiconductor structure, which demarcate the MEMS die D and repetitions of the MEMS die D. The dicing may, for example, be performed by laser dicing and/or the like.

Figure 35:
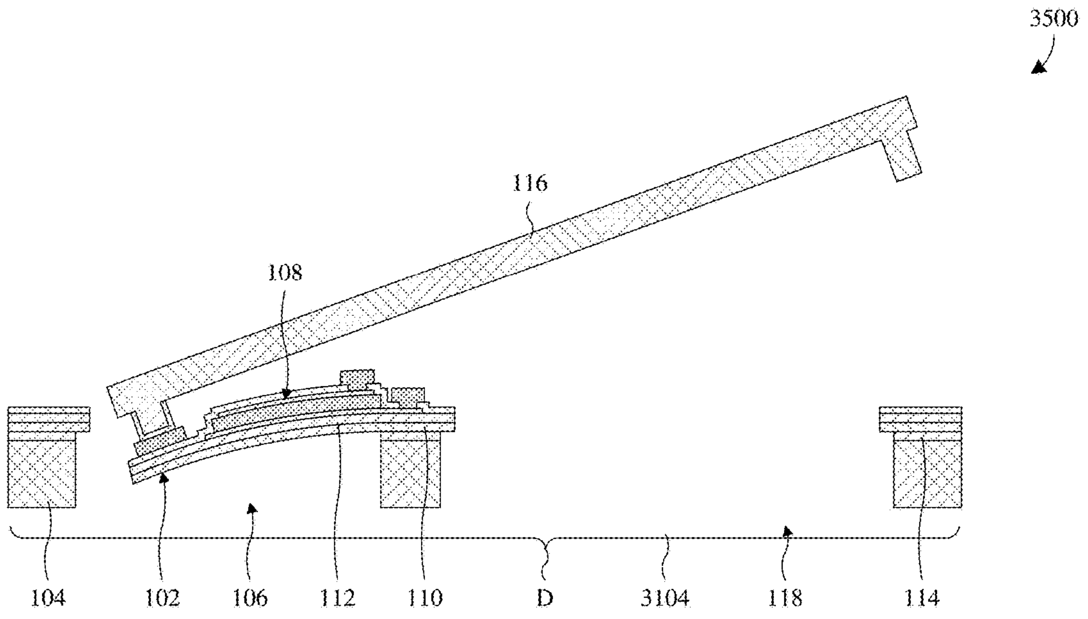

As illustrated by the cross-sectional view 3500 of FIG. 35, the tape frame 3102 and the frame tape 3104 are removed. Further, while not illustrated, the MEMS die D may undergo packaging and/or other post processing.

While FIGS. 16-35 are described with reference to a method, it will be appreciated that the structures shown in these figures are not limited to the method but rather may stand alone separate from the method. While FIGS. 16-35 are described as a series of acts, it will be appreciated that the order of the acts may be altered in other embodiments. While FIGS. 16-35 illustrate and describe as a specific set of acts, some acts that are illustrated and/or described may be omitted in other embodiments. Further, acts that are not illustrated and/or described may be included in other embodiments.

Figure 36:
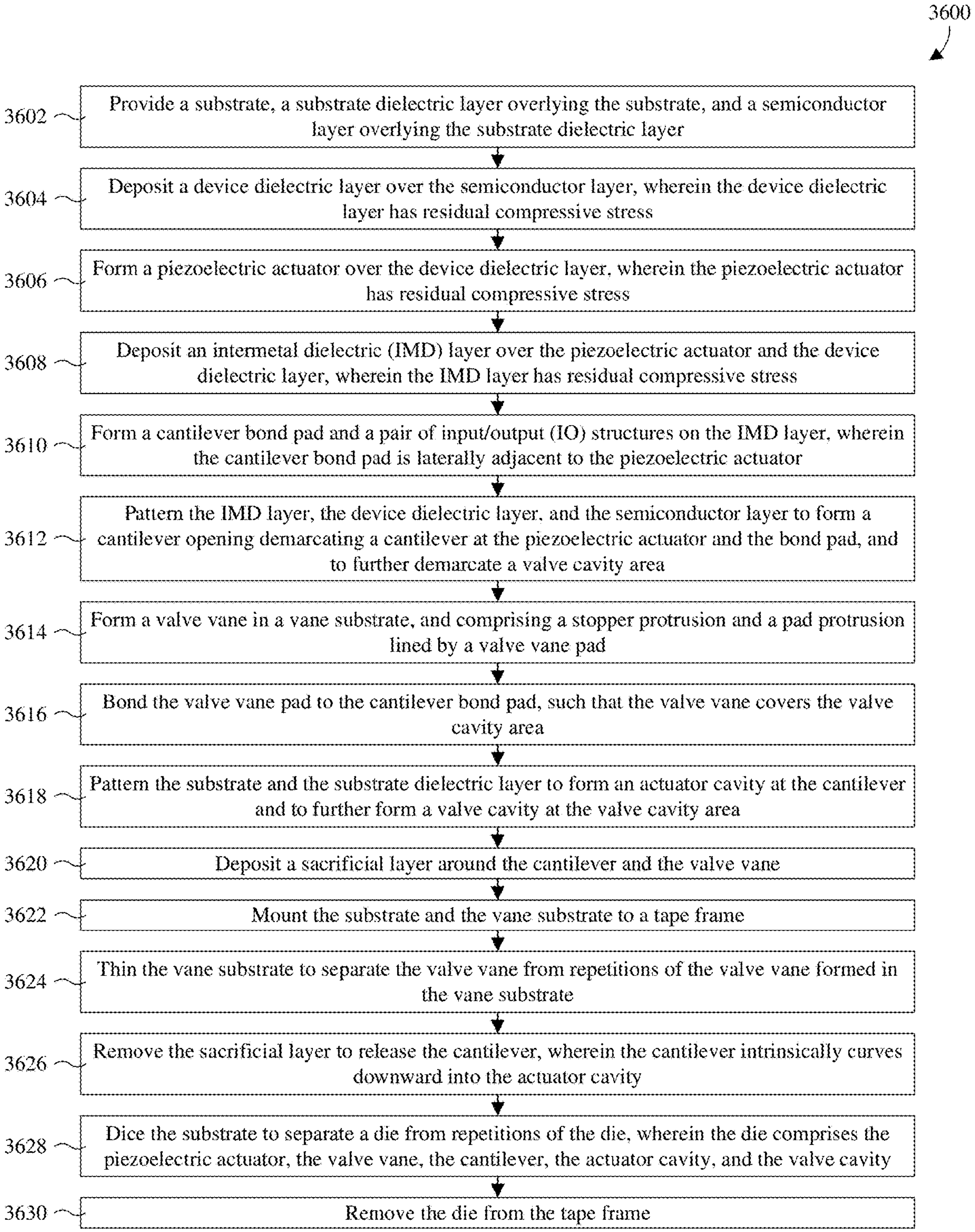
FIG. 36 illustrates a block diagram of some embodiments of the method of FIGS. 16-35.

With reference to FIG. 36, a block diagram 3600 of some embodiments of the method of FIGS. 16-35 is provided.

At act 3602, a substrate, a substrate dielectric layer overlying the substrate, and a semiconductor layer overlying the substrate dielectric layer are provided. See, for example, FIG. 16.

At act 3604, a device dielectric layer is deposited over the semiconductor layer, wherein the device dielectric layer has residual compressive stress. See, for example, FIG. 17.

At act 3606, a piezoelectric actuator is formed over the device dielectric layer, wherein the piezoelectric actuator has residual compressive stress. See, for example, FIGS. 17 and 18.

At act 3608, an IMD layer is deposited over the piezoelectric actuator and the device dielectric layer, wherein the IMD layer has residual compressive stress. See, for example, FIG. 19.

At act 3610, a cantilever bond pad and a pair of IO structures are formed on the IMD layer, wherein the cantilever bond pad is laterally adjacent to the piezoelectric actuator. See, for example, FIG. 20.

At act 3612, the IMD layer, the device dielectric layer, and the semiconductor layer are patterned to form a cantilever opening demarcating a cantilever at the piezoelectric actuator and the bond pad, and to further demarcate a valve cavity area. See, for example, FIGS. 21 and 22.

At act 3614, a valve vane is formed in a vane substrate, wherein the valve vane comprises a stopper protrusion and a pad protrusion lined by a valve vane pad. See, for example, FIGS. 23-26.

At act 3616, the valve vane pad is bonded to the cantilever bond pad, such that the valve vane covers the valve cavity area. See, for example, FIG. 27.

At act 3618, the substrate and the substrate dielectric layer are patterned to form an actuator cavity at the cantilever and to further form a valve cavity at the valve cavity area. See, for example, FIG. 29.

At act 3620, a sacrificial layer is deposited around the cantilever and the valve vane. See, for example, FIG. 30.

At act 3622, the substrate and the vane substrate are mounted to a tape frame. See, for example, FIG. 31.

At act 3624, the vane substrate is thinned to separate the valve vane from repetitions of the valve vane formed in the vane substrate. See, for example, FIG. 32.

At act 3626, the sacrificial layer is removed to release the cantilever, wherein the cantilever intrinsically curves downward into the actuator cavity. See, for example, FIG. 33.

At act 3628, the substrate is diced to separate a die from repetitions of the die, wherein the die comprises the piezoelectric actuator, the valve vane, the cantilever, the actuator cavity, and the valve cavity. See, for example, FIG. 34.

At act 3630, the die is removed from the tape frame. See, for example, FIG. 35.

While the block diagram 3600 of FIG. 36 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 37-48, a series of cross-sectional views 3700-4800 of some second embodiments of a method for forming a piezoelectric MEMS valve is provided. The piezoelectric MEMS valve may, for example, be the piezoelectric MEMS valve in FIGS. 7A, 7B, and 8 or some other suitable piezoelectric MEMS valve. Further, the piezoelectric MEMS valve may, for example, correspond to a die, a chip, or the like.

Figure 37:
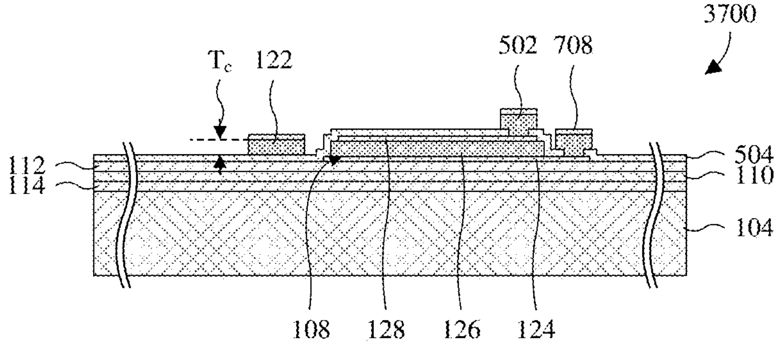
FIGS. 37-48 illustrate a series of cross-sectional views of some second embodiments of a method for forming a piezoelectric MEMS valve.

As illustrated by the cross-sectional view 3700 of FIG. 37, the acts described with regard to FIGS. 16-19 are performed. Further, a cantilever bond pad 122 and a pair of IO structures 502 are formed covered by corresponding cap layers 708.

The cantilever bond pad 122 is formed overlying the IMD layer 504, laterally adjacent to the piezoelectric actuator 108. The pair of IO structures 502 are formed overlying the IMD layer 504 and the piezoelectric actuator 108. Further, the pair of IO structures 502 are formed protruding through the IMD layer 504 respectively to the bottom and top electrodes 124, 128. A top layout of the cantilever bond pad 122 and of the pair of IO structures 502 may, for example, be as shown and described with regard to FIG. 8 or any of FIGS. 9A-9C.

In some embodiments, a passivation layer (not shown) is further deposited over the cantilever bond pad 122 and the pair of IO structures 502 and is then be patterned to form openings exposing the cantilever bond pad 122 and the pair of IO structures 502. In some embodiments, the cap layers 708 are or comprise UBM layers, nickel gold (e.g., ENIG), nickel palladium gold (e.g., ENEPI), OPM, FSM, some other suitable metal(s) and/or conductive material(s), or any combination of the foregoing.

In some embodiments, a process for forming the cantilever bond pad 122, the pair of IO structures 502, and the cap layers 708 comprises patterning the IMD layer 504 to form via openings overlying and respectively exposing the bottom and top electrodes 124, 128. A first conductive layer and a second conductive layer overlying the first conductive layer are then deposited and patterned into the cantilever bond pad 122, the pair of IO structures 502, and the cap layers 708. The cantilever bond pad 122 and the pair of IO structures 502 may correspond to the first conductive layer, whereas the cap layers 708 may correspond to the second conductive layer. The patterning to form the via openings may, for example, be performed by a dry etch, a BOE, some suitable etch, or any combination of the foregoing. The patterning of the first and second conductive layers may, for example, be performed by an ion beam etch, a dry metal etch, a wet metal etch, some suitable etch, or any combination of the foregoing.

Figure 38:
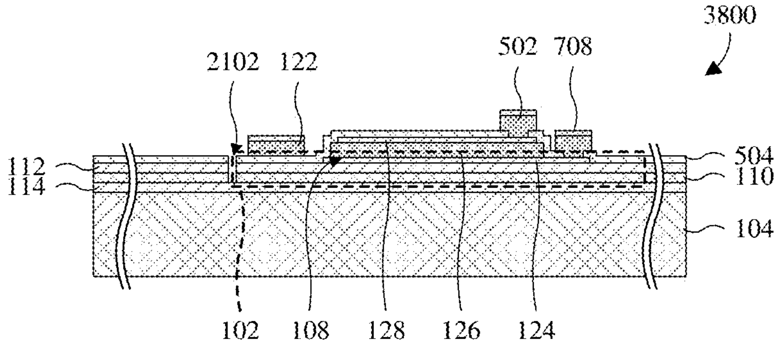

As illustrated by the cross-sectional view 3800 of FIG. 38, the IMD layer 504, the device dielectric layer 112, and the semiconductor layer 110 are patterned to form a cantilever opening 2102 that demarcate a cantilever 102. In some embodiments, the cantilever 102 has a top layout as in FIG. 8 or any of FIGS. 9A-9C. In other embodiments, the cantilever 102 has a top layout as in FIG. 10 or 13. The patterning may, for example, be performed by a series of one or more etches and may, for example, use the substrate dielectric layer 114 as an etch stop.

Figure 39:
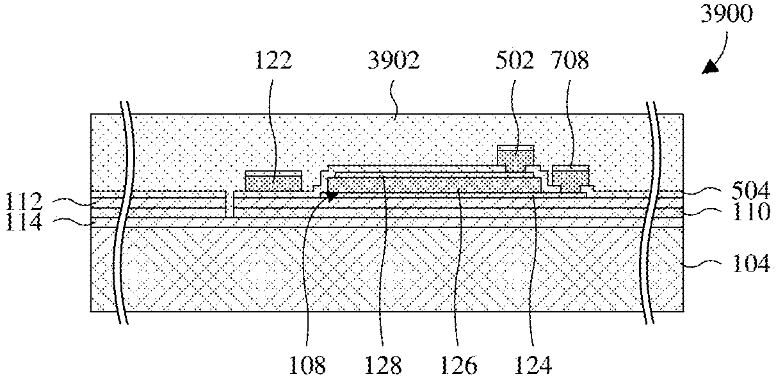

As illustrated by the cross-sectional view 3900 of FIG. 39, a sacrificial layer 3902 is deposited over the cantilever bond pad 122 and the pair of IO structures 502. In some embodiments, a top surface of the sacrificial layer 3902 may also be flattened by a CMP and/or some other suitable planarization process. In some embodiments, the sacrificial layer 3902 is or comprises polyimide, a polymer, photoresist, some other suitable material(s), or any combination of the foregoing. In some embodiments, a carrier substrate (e.g., the carrier substrate 2802 of FIG. 28) may also be bonded to the top surface of the sacrificial layer 3902 to enhance the rigidity and structural strength of the semiconductor structure in FIG. 39.

Figure 40:
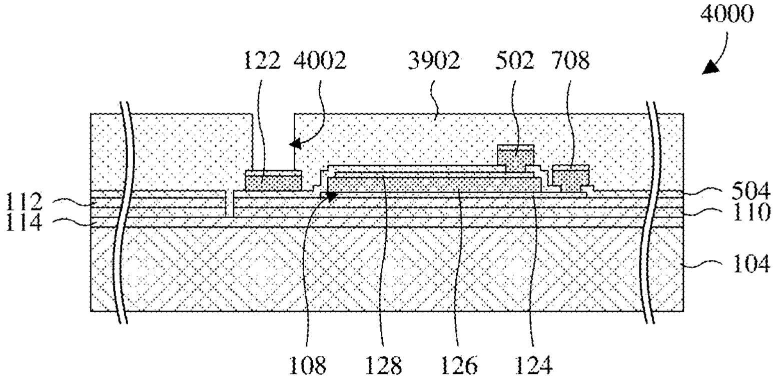

As illustrated by the cross-sectional view 4000 of FIG. 40, the sacrificial layer 3902 is patterned to form a bump opening 4002 overlying and exposing the cap layer 708 corresponding to the cantilever bond pad 122. In alternative embodiments, the patterning is skipped. In some embodiments, additional bump openings are formed outside the cross-sectional view 4000. Such additional bump openings are formed overlying and exposing the cap layers 708 corresponding to the pair of IO structures 502. The patterning may, for example, be performed by a photolithography/etching process or some other suitable patterning process.

Figure 41:
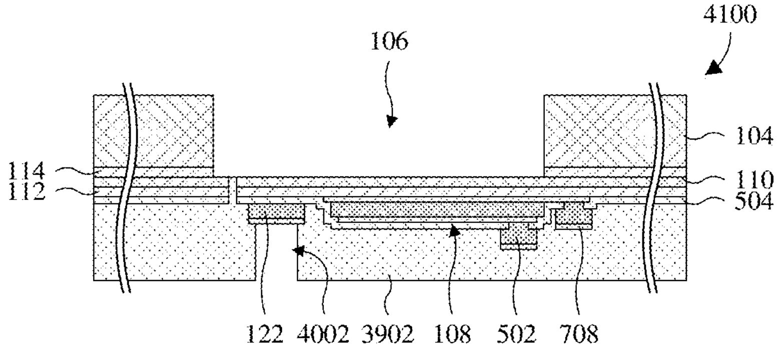

As illustrated by the cross-sectional view 4100 of FIG. 41, the structure of FIG. 40 is vertically flipped. Further, the substrate 104 is thinned (e.g., reduced in thickness) and is then patterned to form an actuator cavity 106. The actuator cavity 106 is formed extending through the substrate 104 and the substrate dielectric layer 114 and further overlapping with the piezoelectric actuator 108 and the cantilever 102.

The thinning may, for example, performed by a CMP and/or the like. The patterning may, for example, be performed by a photolithography/etching process or some other suitable patterning process. The etching may, for example, be performed by Bosh etching, DRIE, some other suitable etching process, or any combination of the foregoing. In some embodiments, the substrate dielectric layer 114 serves as an etch stop during the etching.

Figure 42:
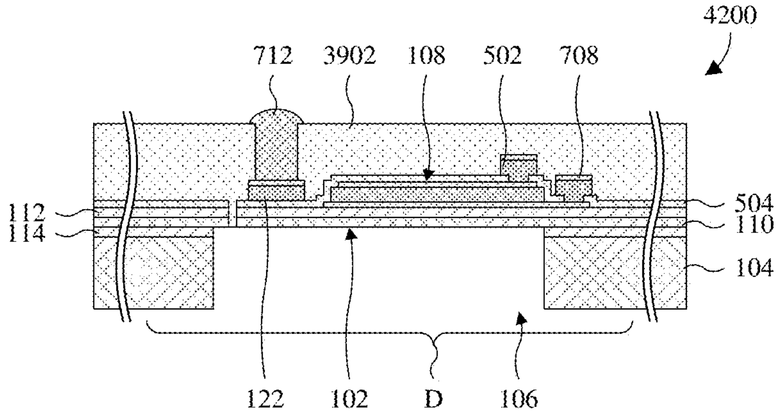

As illustrated by the cross-sectional view 4200 of FIG. 42, the structure of FIG. 41 is vertically flipped and a conductive bump 712 is formed in the bump opening 4002. In some embodiments, the conductive bump 712 is or comprises tin, nickel, copper, a conductive epoxy, some other suitable material(s), or any combination of the foregoing. In some embodiments, the conductive bump 712 is a solder bump that is or comprises tin, nickel, some other suitable material (s), or any combination of the foregoing. In other embodiments, the conductive bump 712 is a plated bump (e.g., a bump formed by plating) that is or comprises copper and/or the like.

Collectively, the cantilever 102, the piezoelectric actuator 108, and the actuator cavity 106 form or otherwise correspond to a MEMS die D. The MEMS die D may, for example, also be known as a MEMS chip or the like. Further, the MEMS die D may repeat in a grid-shaped pattern or some other suitable pattern outside the cross-sectional view 4200, such that there are multiple instances of the MEMS die D. These multiple instances may be concurrently formed according to the acts of FIGS. 37-42.

Figure 43:
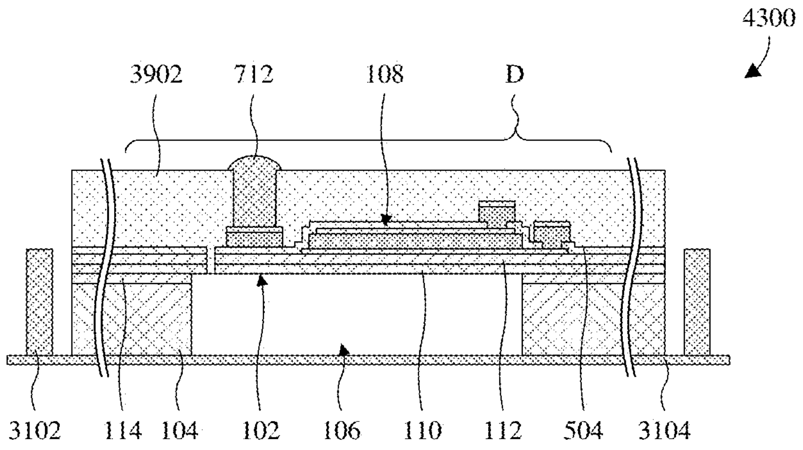

As illustrated by the cross-sectional view 4300 of FIG. 43, the structure of FIG. 42 is taped to a tape frame 3102 with frame tape 3104. The tape frame 3102 may, for example, facilitate dicing or singulation of the MEMS die D.

Figure 44:
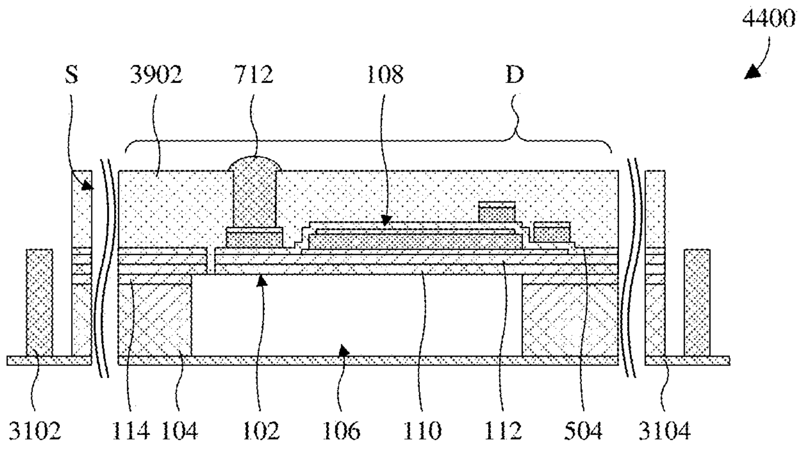

As illustrated by the cross-sectional view 4400 of FIG. 44, the semiconductor structure of FIG. 43 undergoes dicing to separate the MEMS die D from repetitions of the MEMS die D. The dicing may, for example, be performed by removing material at scribe-line regions S of the semiconductor structure, which demarcate the MEMS die D and repetitions of the MEMS die D. The dicing may, for example, be performed by laser dicing and/or the like.

Because the MEMS die D does not include a valve cavity 118, as in the embodiments of FIGS. 16-35, the MEMS die D is smaller. Hence, more repetitions of the MEMS die D may be concurrently formed, whereby manufacturing costs may be reduced.

Figure 45:
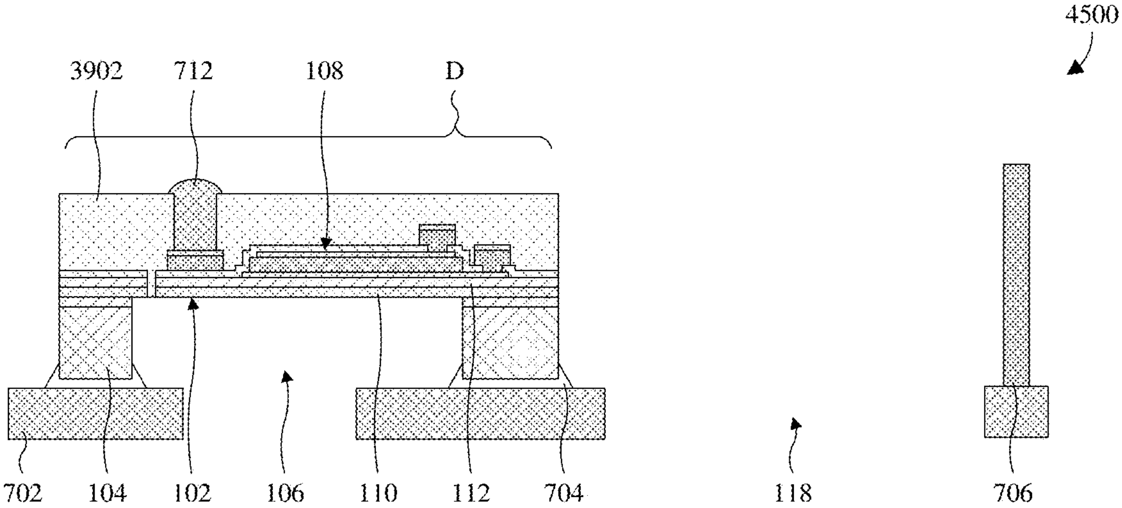

As illustrated by the cross-sectional view 4500 of FIG. 45, the tape frame 3102 and the frame tape 3104 are removed from the MEMS die D. Further, the MEMS die D is mounted to a PCB 702 via an adhesive 704.

The MEMS die D is mounted so the actuator cavity 106 overlies an opening through the PCB 702. In some embodiments, this opening may be viewed as an extension of the actuator cavity 106. Further, the MEMS die D is mounted laterally aside a seal 706 on the PCB 702. The MEMS die D and the seal 706 demarcate a valve cavity 118 overlying an additional opening in the PCB 702. In some embodiments, this additional opening may be viewed as an extension of the valve cavity 118. Because the valve cavity 118 is formed outside the MEMS die D, the valve cavity 118 may be larger than it otherwise be. The seal 706 may, for example, be or comprise plastic, rubber, a seal ring, glue, epoxy, some other suitable material(s), or any combination of the foregoing. The seal 706 may, for example, have a top layout as in any of FIGS. 8 and 9A-9C.

Figure 46:
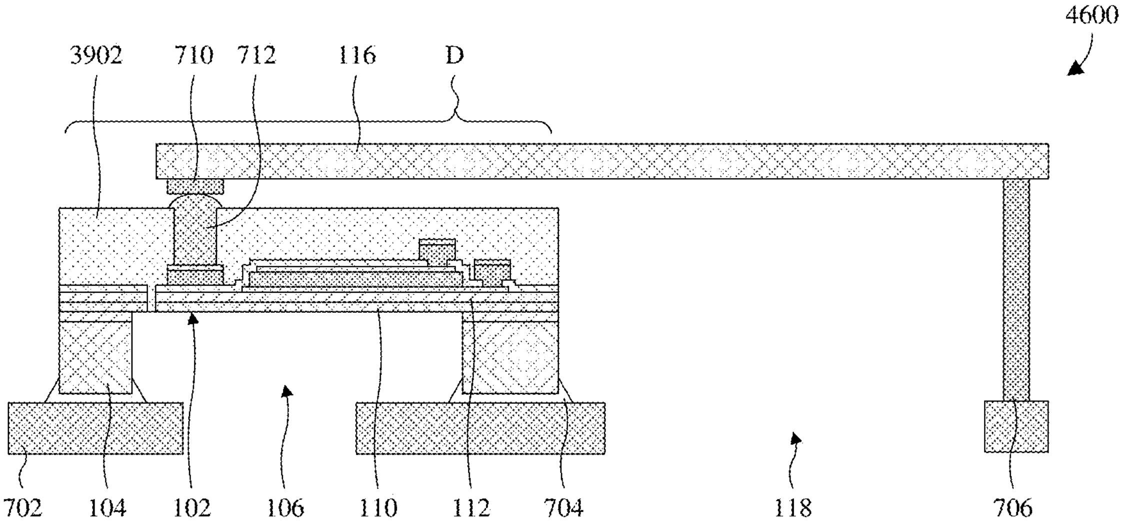

As illustrated by the cross-sectional view 4600 of FIG. 46, a valve vane 116 is formed or otherwise provided with a vane bond pad 710. The vane bond pad 710 is at a bottom of the valve vane 116, at a first end of the valve vane 116. Further, the valve vane 116 has a planar profile but some other suitable profiles (e.g., as in FIGS. 5A and 5B) are amenable. The valve vane 116 may, for example, be or comprise glass, an interposer, silicon, plastic, ceramic, a metal, the like, or any combination of the foregoing.

Also illustrated by the cross-sectional view 4600 of FIG. 46, the valve vane 116 is bonded to the conductive bump 712 via the vane bond pad 710. Further, the valve vane 116 is bonded covering the valve cavity 118 with a second end, opposite the first end, in contact with the seal 706. The bonding may, for example, be performed by fusion bonding, eutectic bonding, some other suitable bonding, or any combination of the foregoing.

Figure 47:
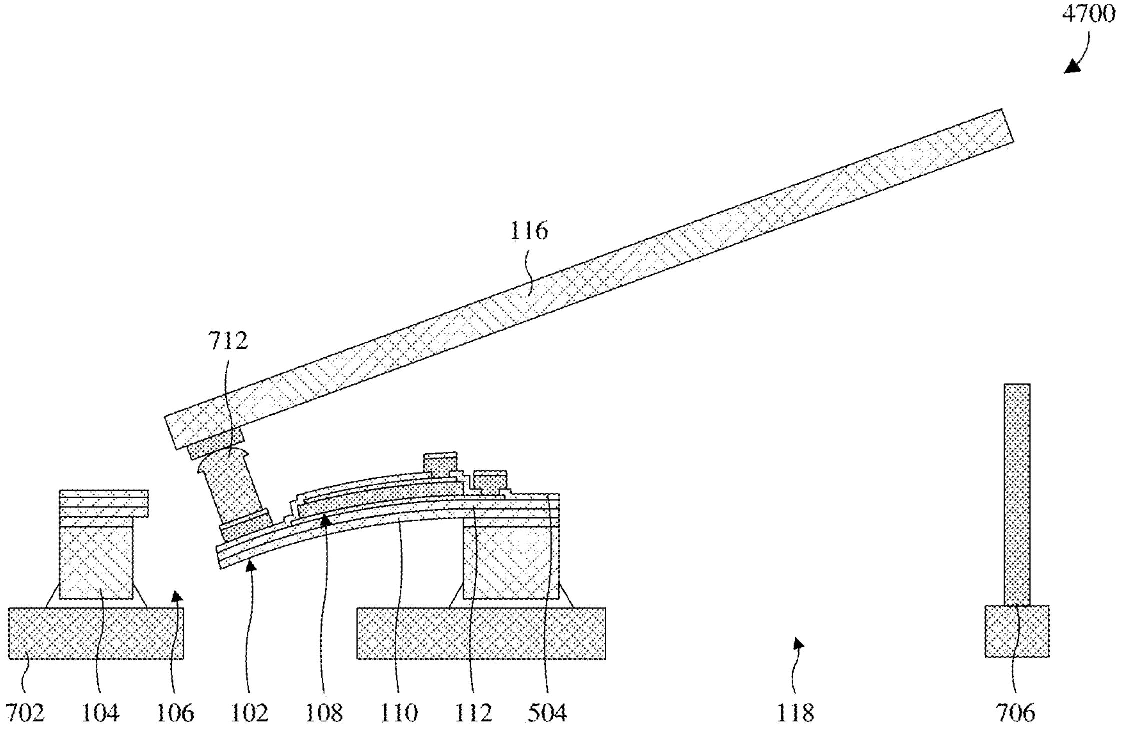

As illustrated by the cross-sectional view 4700 of FIG. 47, the sacrificial layer 3902 is removed. The removal may, for example, be performed by plasma ashing and/or some other suitable removal process. Removing the sacrificial layer 3902 releases the cantilever 102, whereby it reverts to its intrinsic and/or unpowered state.

As noted above, the piezoelectric actuator 108 and the device dielectric layer 112 have residual compressive stress. Further, in some embodiments, the IMD layer 504 has residual compressive stress. The residual compressive stress leads to outward force being transferred to a top of the semiconductor layer 110, which causes the cantilever 102 to curve downward into the actuator cavity 106. Further, because the valve vane 116 is bonded to the cantilever 102, this curve downward inclines the valve vane 116 and opens the valve cavity 118.

During use of the piezoelectric MEMS valve, actuation of the piezoelectric actuator 108 counters the outward force from the residual compressive stress and the cantilever 102 curves upward. The curve upward declines or levels the valve vane 116 until the valve vane 116 comes into contact with the seal 706 at a periphery of the valve cavity 118. Further, the curve upward closes the valve cavity 118, thereby preventing fluid from passing through the valve cavity 118. FIG. 7B provides additional detail.

Figure 48:
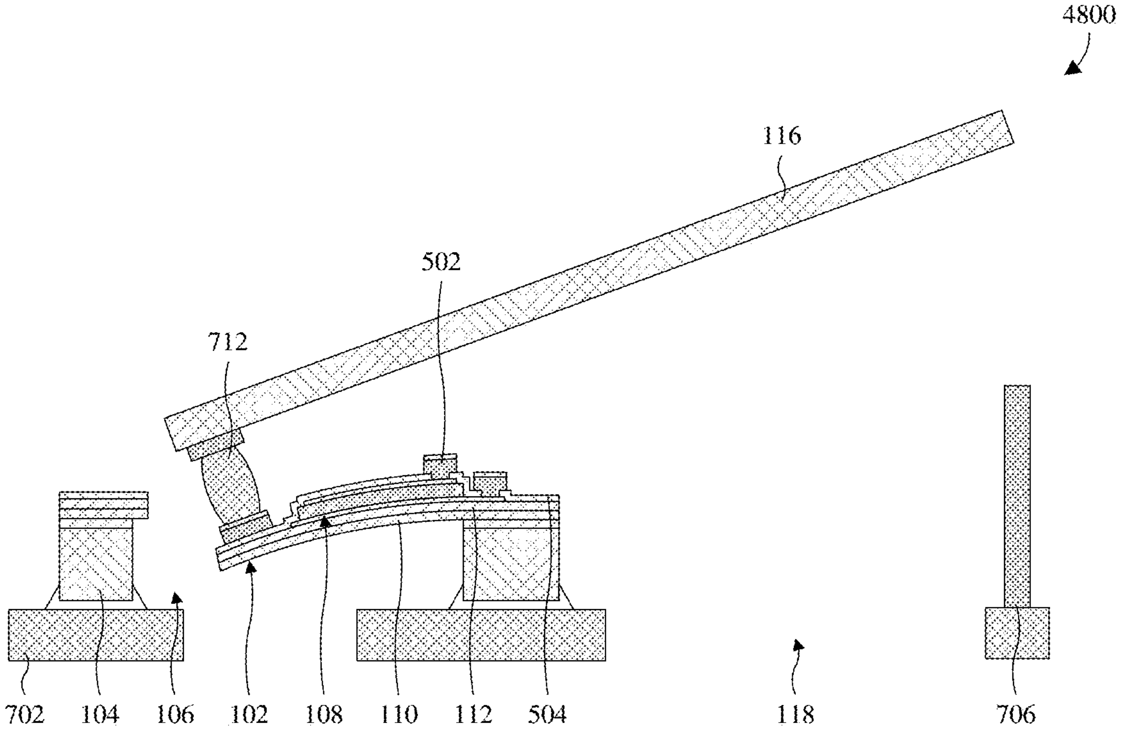

As illustrated by the cross-sectional view 4800 of FIG. 48, the conductive bump 712 may undergoing a reflowing process. Further, while bonding may electrically couple the pair of IO pads 502*p* (see, e.g., FIG. 8) to the PCB 702 outside the cross-sectional view 4800. Further, in some embodiments, a metal lid may be arranged around the piezoelectric MEMS valve.

While FIGS. 37-48 are described with reference to a method, it will be appreciated that the structures shown in these figures are not limited to the method but rather may stand alone separate from the method. While FIGS. 37-48 are described as a series of acts, it will be appreciated that the order of the acts may be altered in other embodiments. While FIGS. 37-48 illustrate and describe as a specific set of acts, some acts that are illustrated and/or described may be omitted in other embodiments. Further, acts that are not illustrated and/or described may be included in other embodiments.

Figure 49:
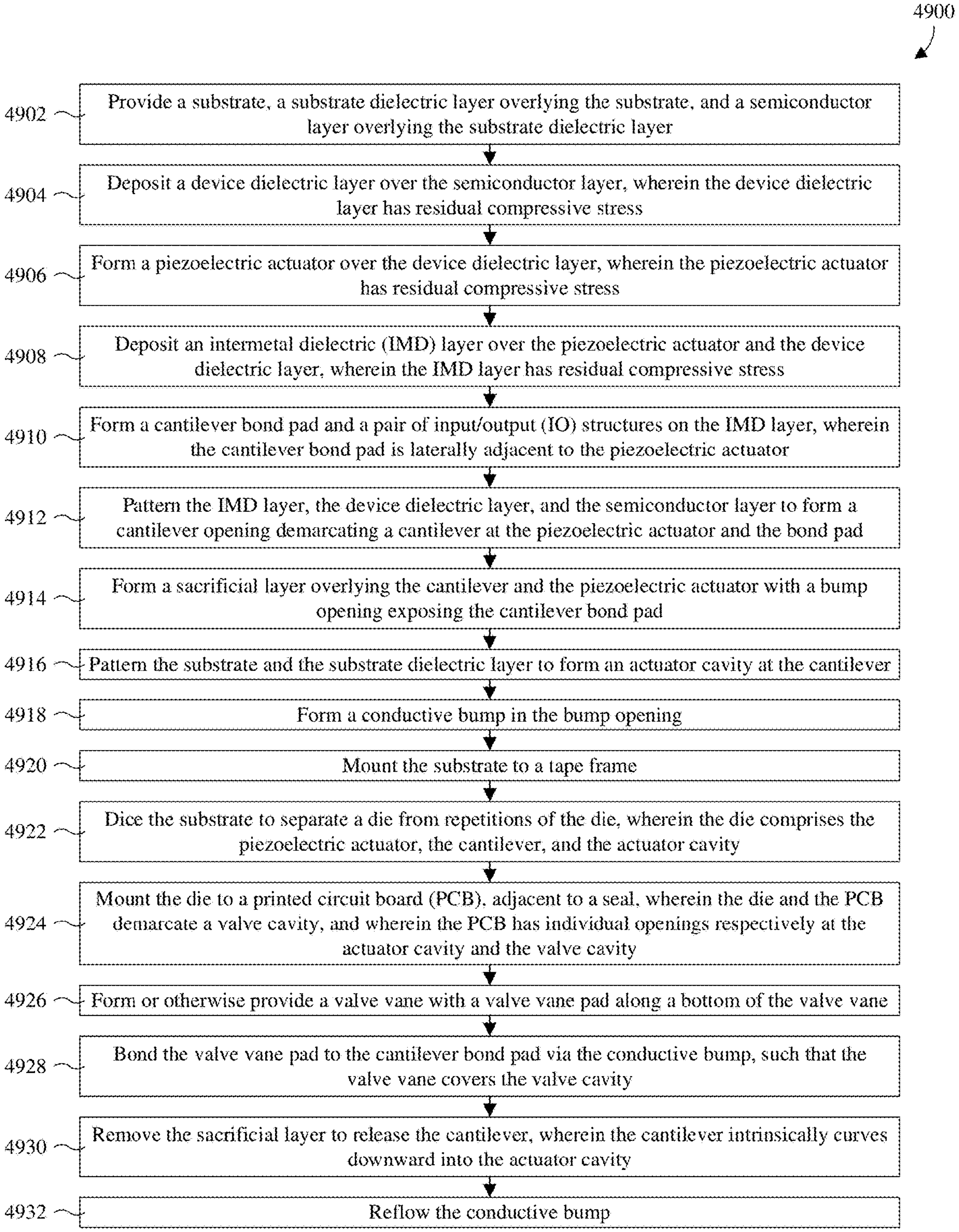
FIG. 49 illustrates a block diagram of some embodiments of the method of FIGS. 37-48.

With reference to FIG. 49, a block diagram 4900 of some embodiments of the method of FIGS. 37-48 is provided.

At act 4902, a substrate, a substrate dielectric layer overlying the substrate, and a semiconductor layer overlying the substrate dielectric layer are provided. See, for example, FIGS. 16 and 37.

At act 4904, a device dielectric layer is deposited over the semiconductor layer, wherein the device dielectric layer has residual compressive stress. See, for example, FIGS. 17 and 37.

At act 4906, a piezoelectric actuator is formed over the device dielectric layer, wherein the piezoelectric actuator has residual compressive stress. See, for example, FIGS. 17, 18, and 37.

At act 4908, an IMD layer is deposited over the piezoelectric actuator and the device dielectric layer, wherein the IMD layer has residual compressive stress. See, for example, FIGS. 19 and 37.

At act 4910, a cantilever bond pad and a pair of IO structures are formed on the IMD layer, wherein the cantilever bond pad is laterally adjacent to the piezoelectric actuator. See, for example, FIG. 37.

At act 4912, the IMD layer, the device dielectric layer, and the semiconductor layer are patterned to form a cantilever opening demarcating a cantilever at the piezoelectric actuator and the bond pad. See, for example, FIG. 38.

At act 4914, a sacrificial layer is formed overlying the cantilever and the piezoelectric actuator with a bump opening exposing the cantilever bond pad. See, for example, FIGS. 39 and 40.

At act 4916, the substrate and the substrate dielectric layer are patterned to form an actuator cavity at the cantilever. See, for example, FIG. 41.

At act 4918, a conductive bump is formed in the bump opening. See, for example, FIG. 42.

At act 4920, the substrate is mounted to a tape frame. See, for example, FIG. 43.

At act 4922, the substrate is diced to separate a die from repetitions of the die, wherein the die comprises the piezoelectric actuator, the cantilever, and the actuator cavity. See, for example, FIG. 44.

At act 4924, the die is mounted to a PCB, adjacent to a seal, wherein the die and the PCB demarcate a valve cavity, and wherein the PCB has individual openings respectively at the actuator cavity and the valve cavity. See, for example, FIG. 45.

At act 4926, a valve vane with a valve vane pad along a bottom of the valve vane is formed or otherwise provided. See, for example, FIG. 46.

At act 4928, the valve vane pad is bonded to the cantilever bond pad via the conductive bump, such that the valve vane covers the valve cavity. See, for example, FIG. 46.

At act 4930, the sacrificial layer is removed to release the cantilever, wherein the cantilever intrinsically curves downward into the actuator cavity. See, for example, FIG. 47.

At act 4932, the conductive bump is reflowed. See, for example, FIG. 48.

While the block diagram 4900 of FIG. 49 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Various embodiments of the present disclosure are directed to a semiconductor structure, including: a cantilever having a first end overlying and bonded to a substrate and further having a second end, opposite the first end, overlying an actuator cavity; a piezoelectric actuator on the cantilever; and a valve vane bonded to the second end of the cantilever and further overlying a valve cavity laterally adjacent to the actuator cavity; wherein the cantilever has a curved profile at the second end, which is offset from the first end in a direction transverse to a top surface of the substrate. In some embodiments, the cantilever has a line-shaped top geometry jutting out over the actuator cavity, wherein the cantilever curves downward from the first end to the second end. In some embodiments, the piezoelectric actuator is configured to curve the cantilever upward in response to actuation. In some embodiments, the semiconductor structure includes: a semiconductor layer overlying the substrate; and a device dielectric layer overlying the semiconductor layer, wherein the piezoelectric actuator overlies the device dielectric layer, which has compressive stress that applies an outward force along a top surface of the semiconductor layer. In some embodiments, the piezoelectric actuator includes a bottom electrode, a piezoelectric layer overlying the bottom electrode, and a top electrode overlying the piezoelectric layer, wherein the bottom electrode and the top electrode have tensile stress, and wherein the piezoelectric layer has compressive stress that counteracts and surpasses the tensile stress. In some embodiments, the semiconductor structure includes an IMD layer overlying the device dielectric layer and the piezoelectric actuator, wherein the IMD layer has compressive stress. In some embodiments, the valve cavity extends through the substrate and is demarcated by a pair of sidewalls of the substrate that oppose each other respectively on opposite sides of the valve cavity. In some embodiments, the valve vane is configured to close the valve cavity in response to actuation of the piezoelectric actuator. In some embodiments, the cantilever has a spiral-shaped top geometry in which the second end of the cantilever is at a center of the spiral-shaped top geometry. In some embodiments, the cantilever includes a plurality of line-shaped segments elongated in parallel and coupled end to end to form a meandering path that meanders from the first end to the second end.

In some embodiments, the present disclosure provides another semiconductor structure, including: a cantilever having a first end overlying and bonded to a substrate and further having a second end, opposite the first end, overlying an actuator cavity; a piezoelectric actuator on the cantilever; and a valve vane overlying and bonded to the second end of the cantilever, wherein a top surface of the valve vane is inclined upward, relative to a top surface of the substrate, from a location directly over the second end of the cantilever. In some embodiments, the cantilever intrinsically curves downward from the first end to the second end. In some embodiments, a valve cavity extends through the substrate, laterally spaced from the actuator cavity, wherein the valve vane has a first protrusion and a second protrusion, wherein the first protrusion overlies and is bonded to the second end of the cantilever on a first side of the valve cavity, and wherein the second protrusion is on a second side of the valve cavity opposite the first side. In some embodiments, the semiconductor structure includes: a MEMS die including the cantilever and the piezoelectric actuator, and in which the actuator cavity is arranged; and a seal neighboring the MEMS die, wherein the seal and the MEMS die demarcate a valve cavity underlying the valve vane. In some embodiments, the semiconductor structure includes a PCB on which the MEMS die and the seal are mounted, wherein the PCB has a pair of openings respectively underlying the actuator cavity and the valve cavity.

In some embodiments, the present disclosure provides a method for forming a semiconductor structure, including: providing a semiconductor layer overlying and spaced from a substrate; depositing a device dielectric layer over the semiconductor layer; forming a piezoelectric actuator over the device dielectric layer; patterning the semiconductor layer and the device dielectric layer to demarcate a cantilever underlying the piezoelectric actuator; bonding a valve vane to the cantilever; patterning the substrate to form an actuator cavity at the cantilever, wherein the cantilever has a planar profile upon completing formation of the actuator cavity; and releasing the cantilever, wherein cantilever transitions from the planar profile to a curved profile during the releasing. In some embodiments, the valve vane is bonded to the cantilever before forming the actuator cavity, wherein the method further includes depositing a sacrificial layer around the cantilever and the valve vane after the patterning to form the actuator cavity, wherein the releasing includes removing the sacrificial layer. In some embodiments, the method includes patterning the substrate to form a valve cavity laterally separated from the actuator cavity, wherein the patterning to form the valve cavity is after the bonding. In some embodiments, the method includes forming a cantilever bond pad on the device dielectric layer, adjacent to the piezoelectric actuator, wherein the cantilever is formed underlying the cantilever bond pad; and forming the valve vane including a pad protrusion lined by a vane bond pad and further including a stopper protrusion, wherein the bonding includes arranging the cantilever bond pad and the vane bond pad into direct contact. In some embodiments, the method includes depositing a sacrificial layer over the piezoelectric actuator and the cantilever before forming the actuator cavity, wherein the valve vane is bonded to the cantilever after forming the actuator cavity, and wherein the releasing includes removing the sacrificial layer. In some embodiments, the method includes: dicing the substrate to form a die, which includes the cantilever, the piezoelectric actuator, and the actuator cavity; and mounting the die to a PCB, neighboring a seal ring, wherein the bonding is performed after the mounting.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:

a cantilever having a first end overlying and bonded to a substrate and further having a second end, opposite the first end, overlying an actuator cavity;

a piezoelectric actuator overlying the actuator cavity on the cantilever; and a valve vane bonded to the second end of the cantilever and further overlying a valve cavity laterally adjacent to the actuator cavity;

wherein the cantilever comprises a multi-layer film having a residual stress that is compressive.

2. The semiconductor structure according to claim 1, wherein the multi-layer film comprises a semiconductor layer and a dielectric layer overlying the semiconductor layer, and wherein the dielectric layer applies an outward force along a top surface of the semiconductor layer.

3. The semiconductor structure according to claim 1, wherein the piezoelectric actuator comprises a bottom electrode, a piezoelectric layer overlying the bottom electrode, and a top electrode overlying the piezoelectric layer, wherein the bottom electrode and the top electrode have tensile stress, and wherein the piezoelectric layer has compressive stress that counteracts and surpasses the tensile stress.

4. The semiconductor structure according to claim 1, further comprising:

a conductive bump between and bonded to the second end of the cantilever and an end of the valve vane, wherein the valve vane has a substantially planar profile.

5. The semiconductor structure according to claim 1, wherein the piezoelectric actuator has a spiral-shaped top geometry.

6. The semiconductor structure according to claim 1, further comprising:

a printed circuit board (PCB) underlying and bonded to the substrate; and a seal mounted on the PCB and demarcating the valve cavity.

7. The semiconductor structure according to claim 6, wherein the seal is confined to a single side of the actuator cavity.

8. A method for forming a semiconductor structure, comprising:

providing a device film overlying a substrate and having residual compressive stress;

forming a piezoelectric actuator overlying the device film;

patterning the device film to demarcate a cantilever on which the piezoelectric actuator is arranged;

bonding a valve vane to the cantilever;

patterning the substrate to form an actuator cavity at the cantilever and a valve cavity adjacent to the actuator cavity;

depositing a sacrificial layer surrounding the cantilever and in the actuator cavity and the valve cavity;

thinning the valve vane with the sacrificial layer in place; and removing the sacrificial layer.

9. The method according to claim 8, wherein the thinning separates the valve vane from multiple other valve vanes formed on a common wafer.

10. The method according to claim 8, further comprising:

bonding the substrate to frame tape;

removing the sacrificial layer with the substrate on the frame tape; and dicing the substrate to form a die, which comprises the cantilever, the piezoelectric actuator, the actuator cavity, and the valve cavity.

11. The method according to claim 10, further comprising:

bonding a carrier substrate to the valve vane, separated from the substrate by the valve vane, wherein the bonding of the carrier substrate is before the sacrificial layer is formed; and removing the carrier substrate after the bonding of the substrate.

12. The method according to claim 8, wherein the removing of the sacrificial layer causes a top surface of the valve vane to incline upward.

13. The method according to claim 8, wherein the patterning to form the valve cavity comprises:
performing a first etch into the device film from a first side of the substrate to demarcate a valve cavity area, wherein the first etch stops before extending to the substrate; and
performing a second etch into a second side of the substrate, opposite the first side of the substrate, to form an opening extending to the valve cavity area.

14. The method according to claim 13, wherein the second etch further forms the actuator cavity.

15. A method for forming a semiconductor structure, comprising:
providing a device film overlying a substrate;
forming a piezoelectric actuator over the device film;
patterning the device film from a first side of the substrate to demarcate a cantilever on which the piezoelectric actuator is arranged;
forming a sacrificial layer overlying the cantilever and the piezoelectric actuator;
patterning the substrate from a second side of the substrate, opposite the first side of the substrate, to form an actuator cavity at the cantilever;
dicing the substrate to form a die, which comprises the cantilever, the piezoelectric actuator, and the actuator cavity;
bonding the die and a seal to a package substrate, wherein the seal demarcates a valve cavity;
bonding a valve vane to the die and overlying the valve cavity; and
removing the sacrificial layer, wherein the cantilever curves downward during the removing of the sacrificial layer.

16. The method according to claim 15, further comprising:
patterning the sacrificial layer to form an opening exposing a pad on the cantilever;
forming a conductive bump filling the opening; and
bonding the valve vane to the conductive bump.

17. The method according to claim 16, wherein the opening is formed before the actuator cavity is formed and the conductive bump is formed after the actuator cavity is formed.

18. The method according to claim 15, wherein the package substrate has a first opening and a second opening respectively exposing the actuator cavity and the valve cavity.

19. The method according to claim 15, wherein the device film comprises a semiconductor layer and a device dielectric layer stacked with the semiconductor layer.

20. The method according to claim 15, wherein a first end of the valve vane is bonded to an end of the cantilever and a second end of the valve vane, opposite the first end of the valve vane, contacts the seal during the bonding.

* * * * *